United States Patent
Hsu et al.

(10) Patent No.: US 12,041,760 B2
(45) Date of Patent: Jul. 16, 2024

(54) MULTI-LAYER HIGH-K GATE DIELECTRIC STRUCTURE

(71) Applicant: Taiwan Semiconductor Manufacturing Co., Ltd., Hsin-Chu (TW)

(72) Inventors: Chih-Yu Hsu, Hsinchu County (TW); Jian-Hao Chen, Hsinchu (TW); Chia-Wei Chen, Hsinchu (TW); Shan-Mei Liao, Hsinchu (TW); Hui-Chi Chen, Hsinchu County (TW); Yu-Chia Liang, Hsinchu (TW); Shih-Hao Lin, Hsinchu (TW); Kuei-Lun Lin, Hsinchu (TW); Kuo-Feng Yu, Hsinchu (TW); Feng-Cheng Yang, Hsinchu County (TW); Yen-Ming Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/884,442

(22) Filed: Aug. 9, 2022

(65) Prior Publication Data

US 2022/0384454 A1 Dec. 1, 2022

Related U.S. Application Data

(62) Division of application No. 17/036,418, filed on Sep. 29, 2020.

(Continued)

(51) Int. Cl.
*H01L 27/11* (2006.01)
*H10B 10/00* (2023.01)

(52) U.S. Cl.
CPC .................................. *H10B 10/12* (2023.02)

(58) Field of Classification Search
CPC ...... H01L 29/511; H01L 29/513; H01L 29/517
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| JP | 2015053474 A | 3/2015 |
| KR | 20090020129 A | 2/2009 |

(Continued)

OTHER PUBLICATIONS

Wang, Bo Chin et al., "Comparison of Trap Behavior Between ZrO2 and HfO2 Gate Stack nMOSFETs by 1/f Noise and Random Telegraph Noise", IEEE Electron Device Letters, vol. 34, No. 2, Feb. 2013, 3 pages.

(Continued)

*Primary Examiner* — Walter H Swanson
(74) *Attorney, Agent, or Firm* — HAYNES AND BOONE, LLP

(57) ABSTRACT

A transistor includes a gate structure that has a first gate dielectric layer and a second gate dielectric layer. The first gate dielectric layer is disposed over the substrate. The first gate dielectric layer contains a first type of dielectric material that has a first dielectric constant. The second gate dielectric layer is disposed over the first gate dielectric layer. The second gate dielectric layer contains a second type of dielectric material that has a second dielectric constant. The second dielectric constant is greater than the first dielectric (Continued)

constant. The first dielectric constant and the second dielectric constant are each greater than a dielectric constant of silicon oxide.

20 Claims, 20 Drawing Sheets

Related U.S. Application Data

(60) Provisional application No. 63/003,011, filed on Mar. 31, 2020.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2002/0130340 A1* | 9/2002 | Ma | H01L 29/513 257/295 |
| 2005/0148127 A1* | 7/2005 | Jung | H01L 21/28194 438/197 |
| 2009/0050954 A1 | 2/2009 | Choi et al. | |
| 2012/0146160 A1 | 6/2012 | Tan et al. | |
| 2013/0280902 A1* | 10/2013 | Jagannathan | H01L 21/283 257/E21.19 |
| 2013/0285116 A1 | 10/2013 | Lochtefeld et al. | |
| 2014/0073126 A1 | 3/2014 | Shen et al. | |
| 2015/0060991 A1 | 3/2015 | Mizutani et al. | |
| 2018/0308852 A1* | 10/2018 | Lee et al. | H01L 21/28194 |
| 2019/0140082 A1* | 5/2019 | Chang | H01L 21/28194 |
| 2019/0164767 A1* | 5/2019 | Hong | H01L 21/02178 |
| 2020/0027996 A1 | 1/2020 | Inoue et al. | |

FOREIGN PATENT DOCUMENTS

| | | |
|---|---|---|
| KR | 20120065229 A | 6/2012 |
| TW | 201347183 | 11/2013 |

OTHER PUBLICATIONS

Kittl, J.A. et al., "High-k dielectrics for future generation memory devices (Invited Paper)", Microeletronic Engineering 86 (2009), pp. 1789-1795.

Engstrom, O. et al., "Navigation aids in the search for future high-k dielectrics: Physical and electrical trends", Science Direct, Solid-State Electronics 51 (2007), pp. 622-626.

Kubicek, S et al., "Low Vt CMOS using doped Hf-based oxides, TaC-based Metals and Laser-only Anneal", IMEC, 2007 IEEE, pp. 49-52.

* cited by examiner

MULTI-LAYER HIGH-K GATE DIELECTRIC STRUCTURE

PRIORITY DATA

The application is a divisional U.S. patent application of U.S. patent application 17,036,418, filed on Sep. 29, 2020, entitled "Multi-Layer High-K Gate Dielectric Structure", which is a utility patent application of provisional U.S. patent application No. 63/003,011, filed on Mar. 31, 2020, entitled "Dual Layer High-K Gate Dielectric Structure", the disclosures of each which are hereby incorporated by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the size of the gate of a transistor continues to get scaled down in each technology node, gate leakage may become an issue. Gate leakage is undesirable since it may degrade device performance such as speed and/or power consumption. Conventional methods of semiconductor fabrication have not devised a satisfactory solution to this issue. Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
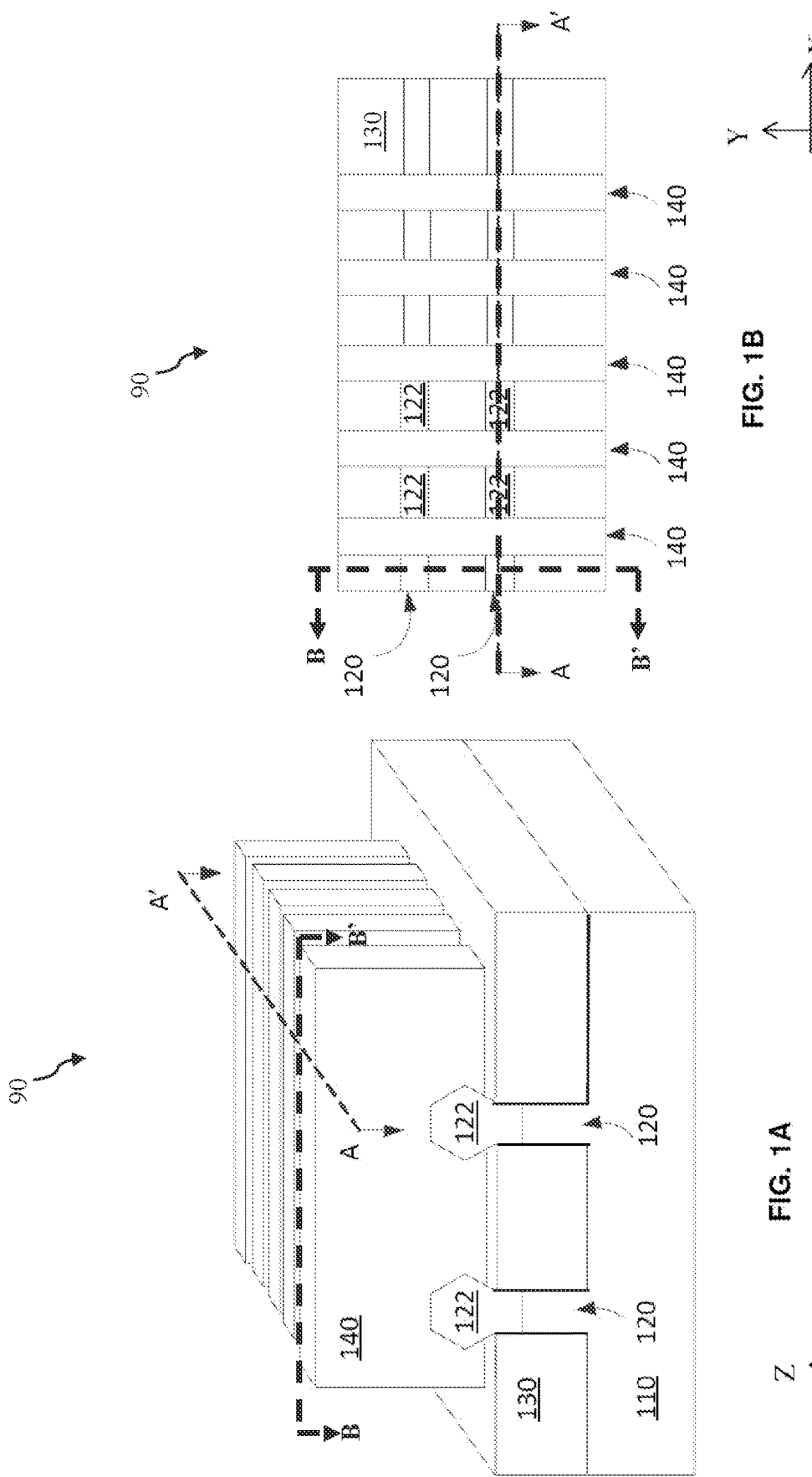
FIG. 1A is a perspective view of an IC device according to various aspects of the present disclosure.
FIG. 1B is a planar top view of an IC device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-line FETs (FinFETs). One aspect of the present disclosure involves forming a multi-layer high-k gate dielectric. In that regard, conventional metal oxide semiconductor field effect transistors (MOSFETs) include a source component, a drain component, a channel component that is located between the source component and the drain component, and a gate component that is located above the channel component. The gate component may include a gate dielectric and a gate electrode. The gate dielectric functions as an electrically insulating pad. Transistor performance may be improved by reducing the thickness of the gate dielectric.

However, as the thickness of the gate dielectric becomes thinner as the scaling down process continues, transistors may experience current leakage and excessive heat, which may be referred to as gate leakage. Gate leakage may lead to problems such as excessive power consumption, poorer reliability, and/or degraded device performance. The recent use of high-k materials to implement the gate dielectric has allowed the gate dielectric to be substantially thicker while achieving the same capacitance equivalent thickness (CET) of an entire gate structure as a much thinner conventional silicon oxide gate dielectric. In that regard, using a high-k gate dielectric may be beneficial with respect to equivalent oxide thickness (EOT). In that regard, equivalent oxide thickness is a distance, usually given in nanometers (nm), which indicates how thick a silicon oxide film would need to be to produce the same effect as the high-k material being used. Materials having larger dielectric constants enable thicker films (still having a low equivalent oxide thickness) to be used while retaining fast transistor switching. As such, high-k dielectric materials have become good candidates for implementing a gate dielectric of a transistor. Unfortunately, high-k dielectric materials also have lower bandgaps, which are associated with higher gate leakage. As the semiconductor technology node progresses to the 7-nanometer generation or smaller, these problems discussed above become exacerbated.

To overcome the problems discussed above, the present disclosure forms a gate structure that includes not just one, but multiple different gate dielectric layers that have different material compositions. In a dual-layer gate dielectric embodiment, the gate dielectric includes a bottom gate dielectric layer that is implemented closer to a channel of the transistor, as well as a top gate dielectric layer that is located on top of the bottom gate dielectric layer. The bottom gate dielectric layer and the top gate dielectric layer have different properties and/or physical characteristics from one another. For example, the top gate dielectric layer may have a greater dielectric constant than the bottom gate dielectric layer (though they both have a high-k material composition), so as to ensure that the overall dielectric constant of the gate structure is still sufficiently high, such that a low equivalent oxide thickness may be maintained. The top gate dielectric layer also has fewer traps than the bottom gate dielectric layer, which may result in a lower noise level and faster speed. Meanwhile, the bottom gate dielectric layer has a material composition that is configured to achieve a better interface (or better integration) with a layer disposed below the gate structure, such as an interfacial oxide layer. The thicknesses and material compositions of the top gate dielectric layer and the bottom gate dielectric layer are configured such that a desired high-k dielectric value may be obtained for the gate structure to increase speed, without causing too much gate leakage.

In a tri-layer gate dielectric embodiment, the gate dielectric includes a bottom gate dielectric layer (e.g., similar to the bottom layer of the dual-layer gate dielectric scheme) capable of forming a good interface with the interfacial layer below, a middle layer (e.g., similar to the top layer of the dual-layer gate dielectric scheme) that is capable of achieving a high dielectric constant and/or fewer traps, as well as a top layer that is capable of forming a good interface with the metal gate electrode above and/or capable of facilitate the tuning of threshold voltages. The details of the gate structure are discussed below with reference to FIGS. 1-20.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, though the IC device 90 as illustrated is a three-dimensional FinFET device, the concepts of the present disclosure may also apply to planar FET devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin structure 120. In some embodiments, the gate structures 140 may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structures 140 are oriented lengthwise along the Y-direction, i.e., generally perpendicular to the fin structures 120. In many embodiments, the IC device 90 includes additional features such as gate spacers disposed along sidewalls of the gate structures 40, hard mask layer(s) disposed over the gate structures 40, and numerous other features. For purpose of simplicity, the processing steps of the present disclosure are described in one embodiment with reference to cross-sectional views corresponding to FIGS. 2-15, where the cross-sections of the IC device 90 are taken along the dashed line A-A' and B-B' as illustrated in FIGS. 1A-1B. Specifically, the cross-sectional views taken along the dashed line A-A' corresponds to an X-Z cross-section cut (e.g., a plane defined by the X-direction and the Z-direction of FIG. 1A), and the cross-sectional views taken along the dashed line B-B' corresponds to a Y-Z cross-section cut (e.g., a plane defined by the Y-direction and the Z-direction of FIG. 1A).

Figure 2:
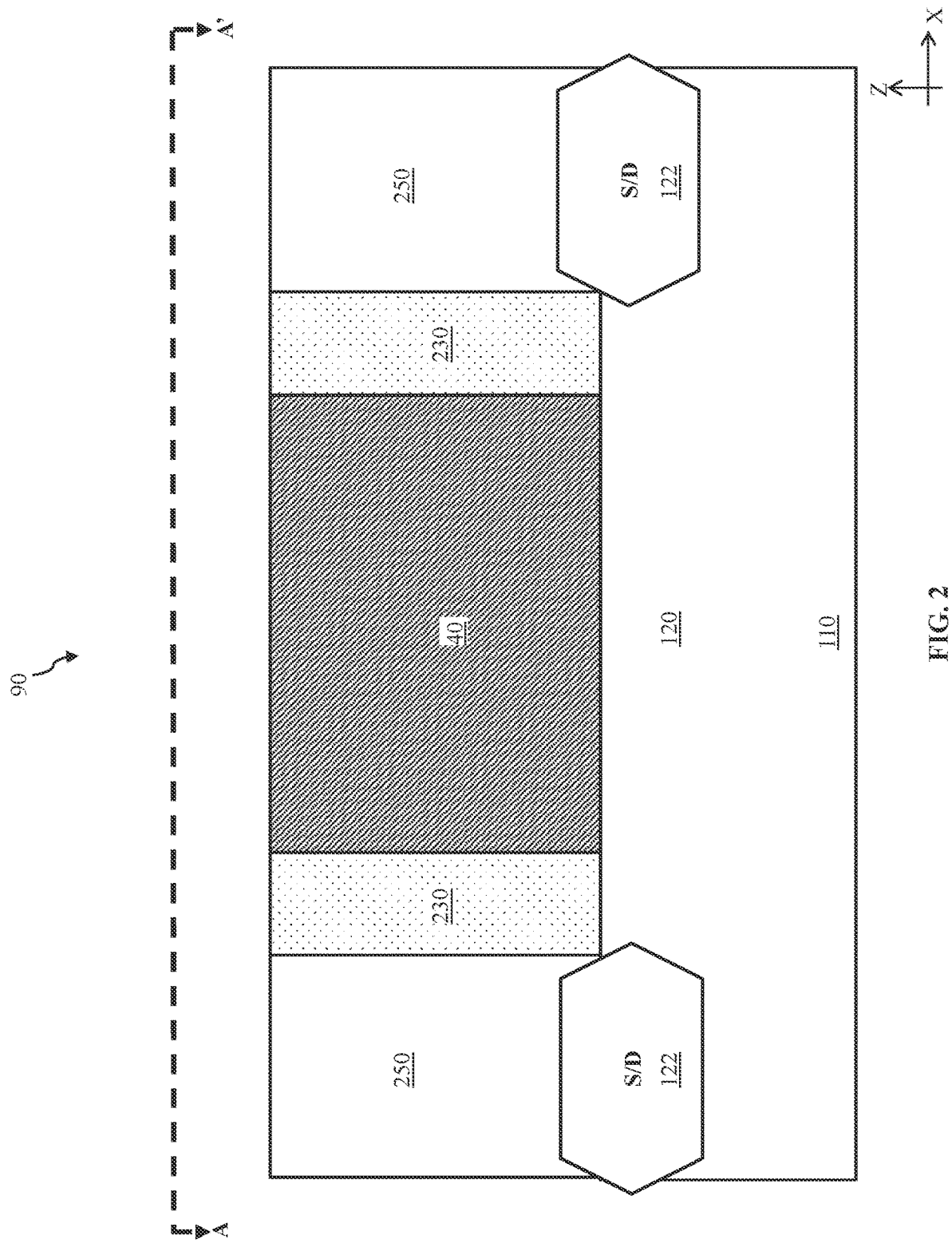
FIGS. 2-13 are cross-sectional views of an IC device at various stages of fabrication according to various aspects of the present disclosure.
Figure 3:
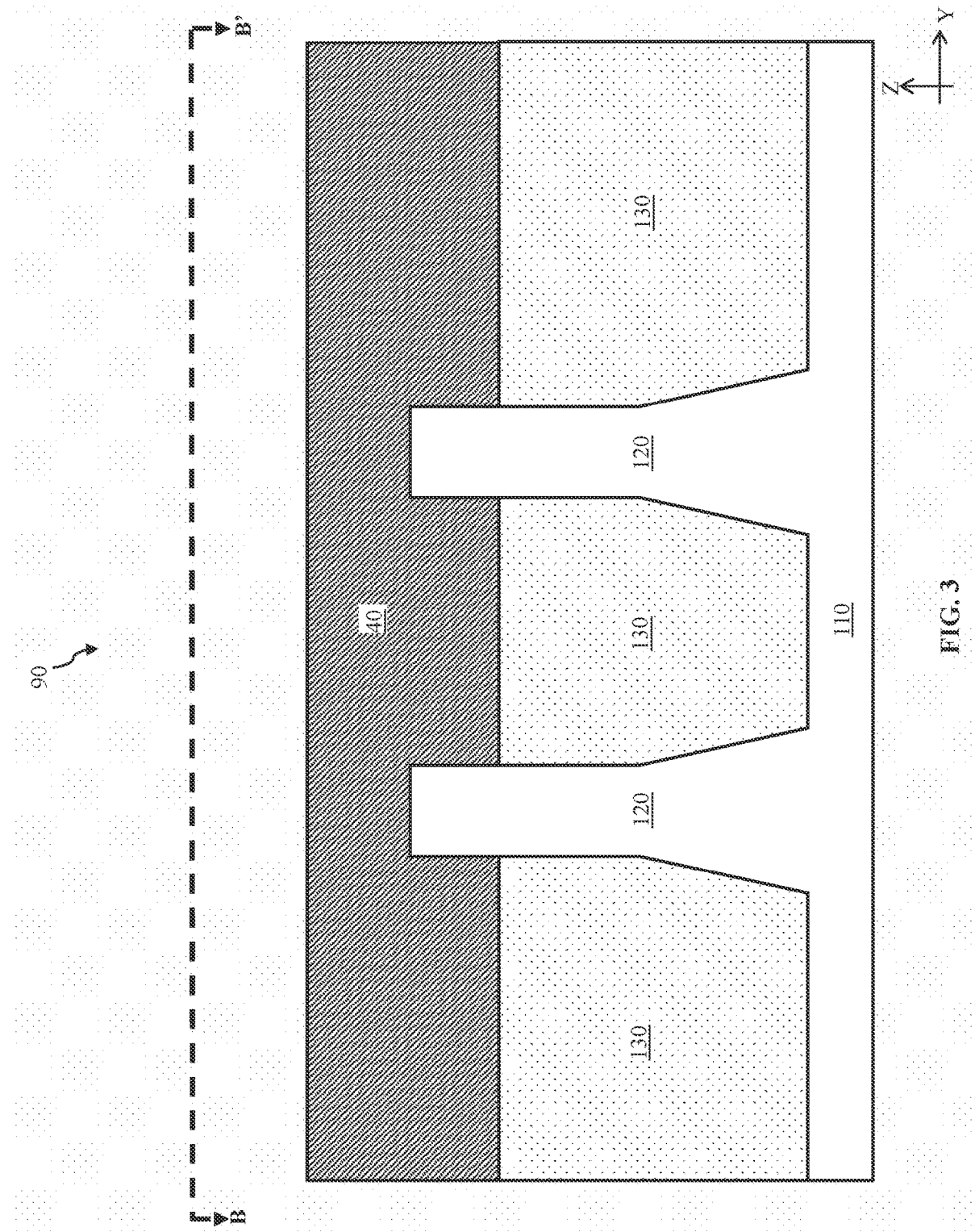

Referring now to FIGS. 2-3, the IC device 90 at this stage of fabrication includes the substrate 110 discussed above. Dummy gate structures 40 are formed over the substrate 110 in the Z-direction that is orthogonal to the horizontal plane defined by the X-direction and Y-direction. The dummy gate structures 40 each interpose a source region and a drain region (e.g., the source/drain regions containing the source/drain features 122), where a channel region is defined in substrate 110 between the source region and the drain region. Dummy gate structures 40 engage the channel regions, such that current can flow between the source/drain regions during operation. In some implementations, dummy gate structures 40 are formed over fin structures (e.g., the fin structures 120 of FIGS. 1A-1B), such that the dummy gate structures 40 each wrap a portion of the fin structures 120. For example, the dummy gate structures 40 wrap channel regions of the fin structures 120, thereby interposing source regions and drain regions of the fin structure 120.

The dummy gate structures 40 may each include a dummy gate dielectric and a dummy gate electrode that is formed over the dummy gate dielectric. In some embodiments, the dummy gate dielectric may include silicon oxide ($SiO_2$), and the dummy gate electrode may include polysilicon. As shown in the Y-Z cross-sectional view of FIG. 3, each dummy gate structure 40 may at least partially wrap around a plurality of the fin structures 120.

Still referring to FIG. 2, the source/drain features 122 are formed in the source/drain regions of the substrate 110. In some embodiments, the source/drain features 122 may be formed using epitaxial processes. For example, a semiconductor material is epitaxially grown on the substrate 110, thereby forming the source/drain features 122 as epitaxially-grown structures. In the depicted embodiment, dummy gate structures 40 interpose respective source/drain features 122, and respective channel regions are defined in substrate 110 between respective epitaxial source/drain features 122 underneath the respective dummy gate structures 40. The IC device 90 can thus be configured to include transistors that includes gate structures that will be formed later to replace the dummy gate structures 40 and their corresponding source/drain features 122 and channel regions. In some implementations, the dummy gate structures 40 each wrap source/drain regions of the fin structures (e.g., the fin structures 120 of FIGS. 1A-1B), extending from substrate 110, such that the transistors are configured as FinFETs.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 110. The source/drain features 122 are doped with n-type dopants and/or p-type dopants. In some implementations, where a transistor is configured as an n-type device, the source/drain features 122 can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device, the source/drain features 122 can be silicon-and-germanium-containing epitaxial layers doped with boron, other p-type dopant, or combinations thereof (for example, forming Si:Ge:B epitaxial layers). In some implementations, the source/drain features 122 include materials and/or dopants that achieve desired tensile stress and/or compressive stress in the channel region. In some implementations, the source/drain features 122 are doped during deposition by adding impurities to a source material of the epitaxy process. In some implementations, the source/drain features 122 are doped by an ion implantation process after a deposition process. In some implementations, annealing processes are performed to activate dopants in the source/drain features 122 and/or other source/drain regions of the IC device 90.

As shown in FIG. 3, an isolation structure 130 may also be formed over and/or in substrate 110 to isolate various regions of the IC device 90. For example, the isolation structure 130 may define and electrically isolate active device regions and/or passive device regions from each other. In some implementations, the isolation structure 130 can be configured to isolate transistors (corresponding with the gate structures that will be formed to replace the dummy gate structures 40 and the source/drain features 122) from other transistors, devices, and/or regions of the IC device 90. The isolation structure 130 include an isolation material, such as silicon oxide, silicon nitride, silicon oxynitride, other suitable isolation material (for example, including silicon, oxygen, nitrogen, carbon, and/or other suitable isolation constituent), or combinations thereof. The isolation structure 130 can include different structures, such as shallow trench isolation (STI) structures, deep trench isolation (DTI) structures, and/or local oxidation of silicon (LOCOS) structures.

In some implementations, STI structures (as an example of the isolation structure 130) can be formed by etching trenches in substrate 110 (for example, by using a dry etch process and/or wet etch process) and filling the trenches with insulator material (for example, by using a chemical vapor deposition process or a spin-on glass process). A chemical mechanical polishing (CMP) process may be performed to remove excessive insulator material and/or planarize a top surface of the STI structures. In some implementations, STI structures can be formed by depositing an insulator material over substrate 110 after forming fins, such that the insulator material layer fills gaps (trenches) between fin structures, and then etching back the insulator material layer. In some implementations, the isolation structure 130 may include multilayer structures that fill trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, the isolation structure 130 may include a dielectric layer disposed over a doped liner layer (including, for example, boron silicate glass or phosphosilicate glass).

As shown in FIG. 2, gate spacers 230 may be formed adjacent to the gate structures 40, for example on the sidewalls of the gate structures 40 in the X-direction. The gate spacers 230 may be formed by depositing a dielectric material and patterning the dielectric material. The deposited dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 110 and subsequently anisotropically etched to form the gate spacers 230.

Although not specifically illustrated herein for reasons of simplicity, the gate spacers 230 may include a multi-layer structure in some embodiments. For example, the gate spacers 230 may each include a first dielectric layer that includes silicon nitride and a second dielectric layer that includes silicon oxide. In some implementations, the gate spacers 230 may include more than one set of spacers, such as seal spacers, offset spacers, sacrificial spacers, dummy spacers, and/or main spacers, formed adjacent to the gate structures 40. In such implementations, the various sets of spacers can include materials having different etch rates. For example, a first dielectric layer including silicon and oxygen can be deposited over substrate 110 and subsequently aniso- tropically etched to form a first spacer set adjacent to gate stacks, and a second dielectric layer including silicon and nitrogen can be deposited over substrate 110 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in the source/drain (S/D) regions 122 before and/or after forming gate spacers 230.

An interlayer dielectric (ILD) layer 250 is disposed over the substrate 110 and the gate structures 40 in the Z-direction and surrounds the dummy gate structures 40 laterally, for example in the X-direction. In some embodiments, the ILD layer 250 may include a dielectric material, for example silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. In some implementations, the ILD layer 250 can include a multilayer structure having multiple dielectric materials. The ILD layer 250 may be formed over the substrate 110 by a deposition process (such as CVD, PVD, ALD, HDPCVD, MOCVD, RPCVD, PECVD, LPCVD, ALCVD, APCVD, other suitable methods, or combinations thereof). In some implementations, the ILD layer 250 is formed by a flowable CVD (FCVD) process that includes, for example, depositing a flowable material (such as a liquid compound) over the substrate 110 and converting the flowable material to a solid material by a suitable technique, such as thermal annealing and/or ultraviolet radiation treating. Subsequent to the deposition of the ILD layer 250, one or more CMP process and/or other planarization process may be performed, such that ILD layer 250 has a substantially planar upper surface.

Figure 4:
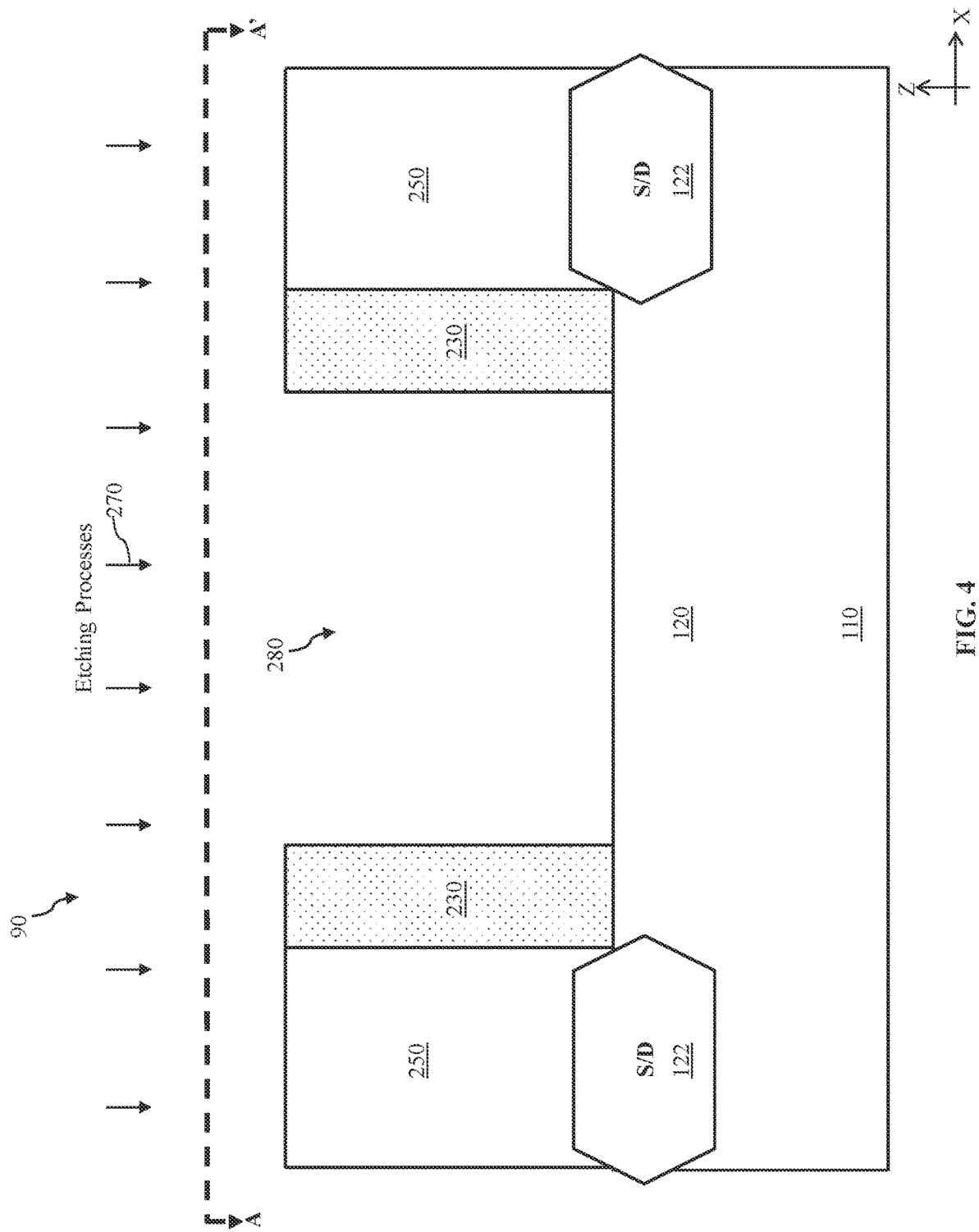
Figure 5:
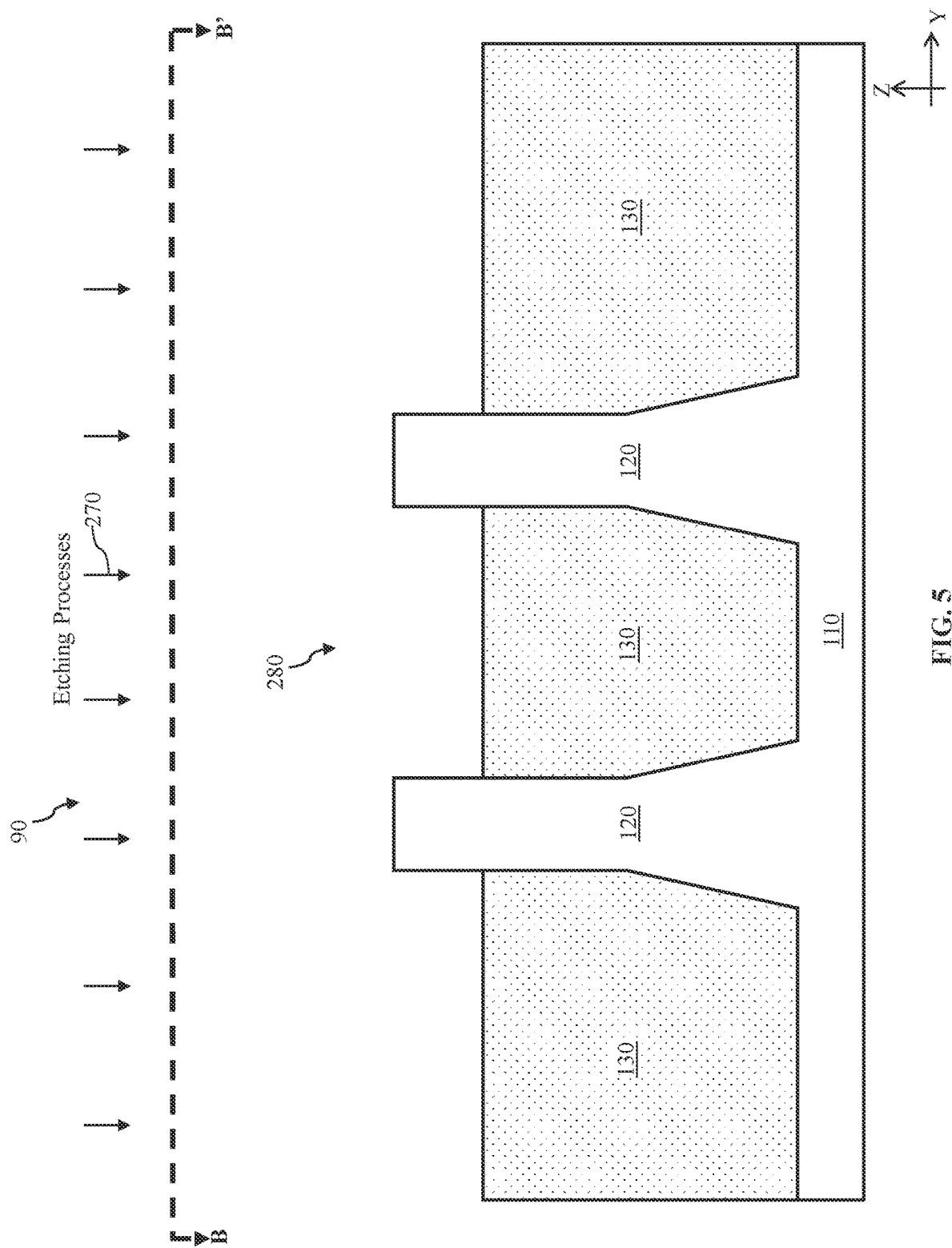

Referring now to FIGS. 4 and 5, one or more etching processes 270 are performed to the IC device 90 to remove the dummy gate structures 40. The one or more etching processes 270 may include wet etching processes or dry etching processes, and they may be performed with a sufficient etching selectivity between the materials of the dummy gate structures 40 and the rest of the materials of the IC device 90, such as the ILD layer 250, the gate spacers 230, and the fin structures 120. In other words, the one or more etching processes 270 may be able to etch away the dummy gate electrode (e.g., containing polysilicon) and the dummy gate dielectric (e.g., containing silicon oxide) while the ILD layer 250, the gate spacers 230, and the fin structures 120 remain substantially intact. As a result of the performance of the one or more etching processes 270, trenches 280 (or recesses) are formed in place of the removed dummy gate structures 40. For example, the trenches 280 may expose the upper surfaces of the fin structures 120 and the side surfaces of the gate spacers 230.

Figure 6:
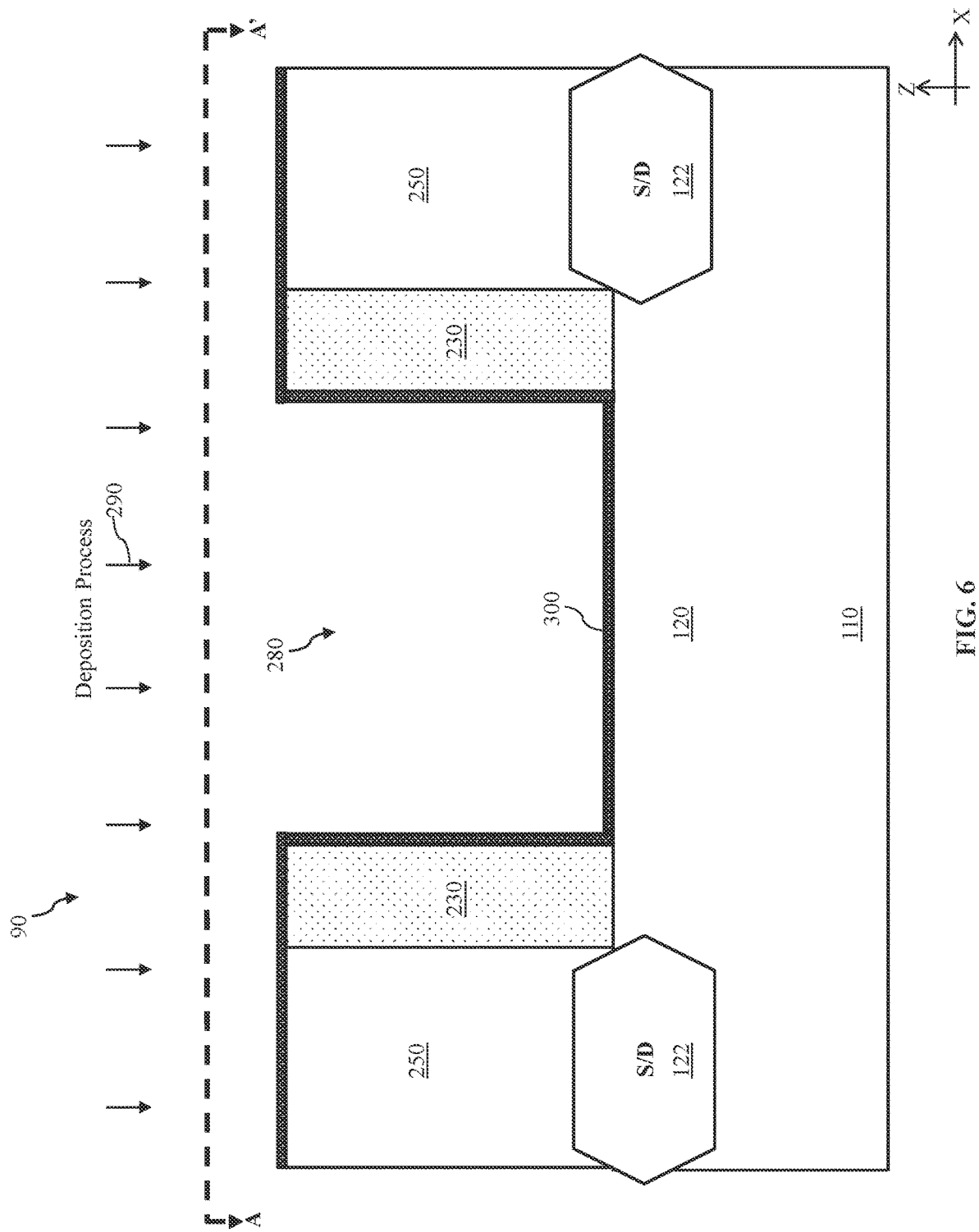
Figure 7:
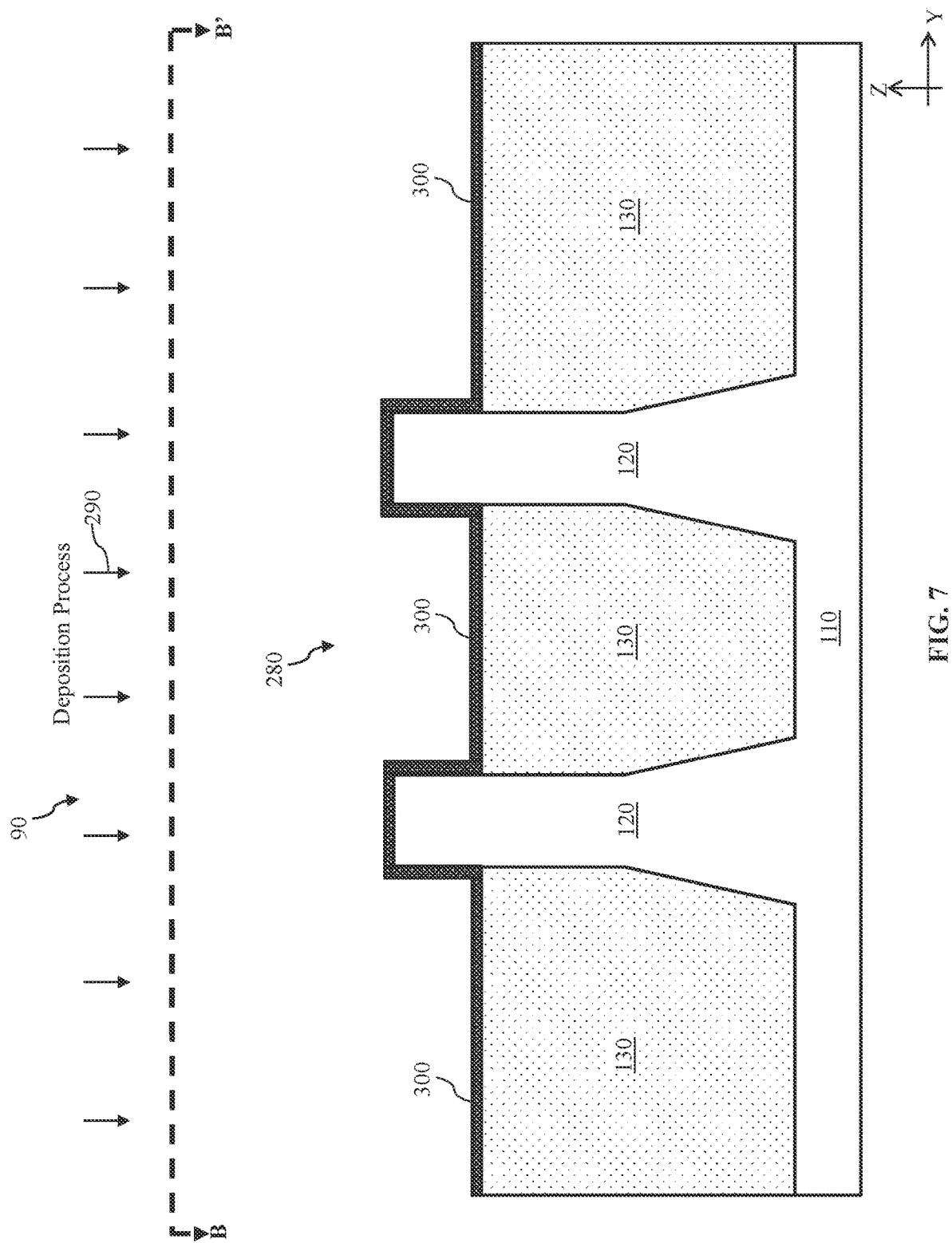

Referring now to FIGS. 6 and 7, a deposition process 290 is performed to the IC device 90 to form an interfacial layer 300 in the trenches 280. The deposition process 290 may include various types of CVD, PVD, or ALD processes, or combinations thereof. The interfacial layer 300 is formed on the exposed surfaces of the fin structures 120. Portions of the interfacial layer 300 are also formed on the side surfaces of the gate spacers 230 and the upper surfaces of the ILD layer 250. As such, the portion of the interfacial layer 300 formed inside the trenches 280 may have a U-shape. In some embodiments, the interfacial layer 300 includes silicon oxide.

Figure 8:
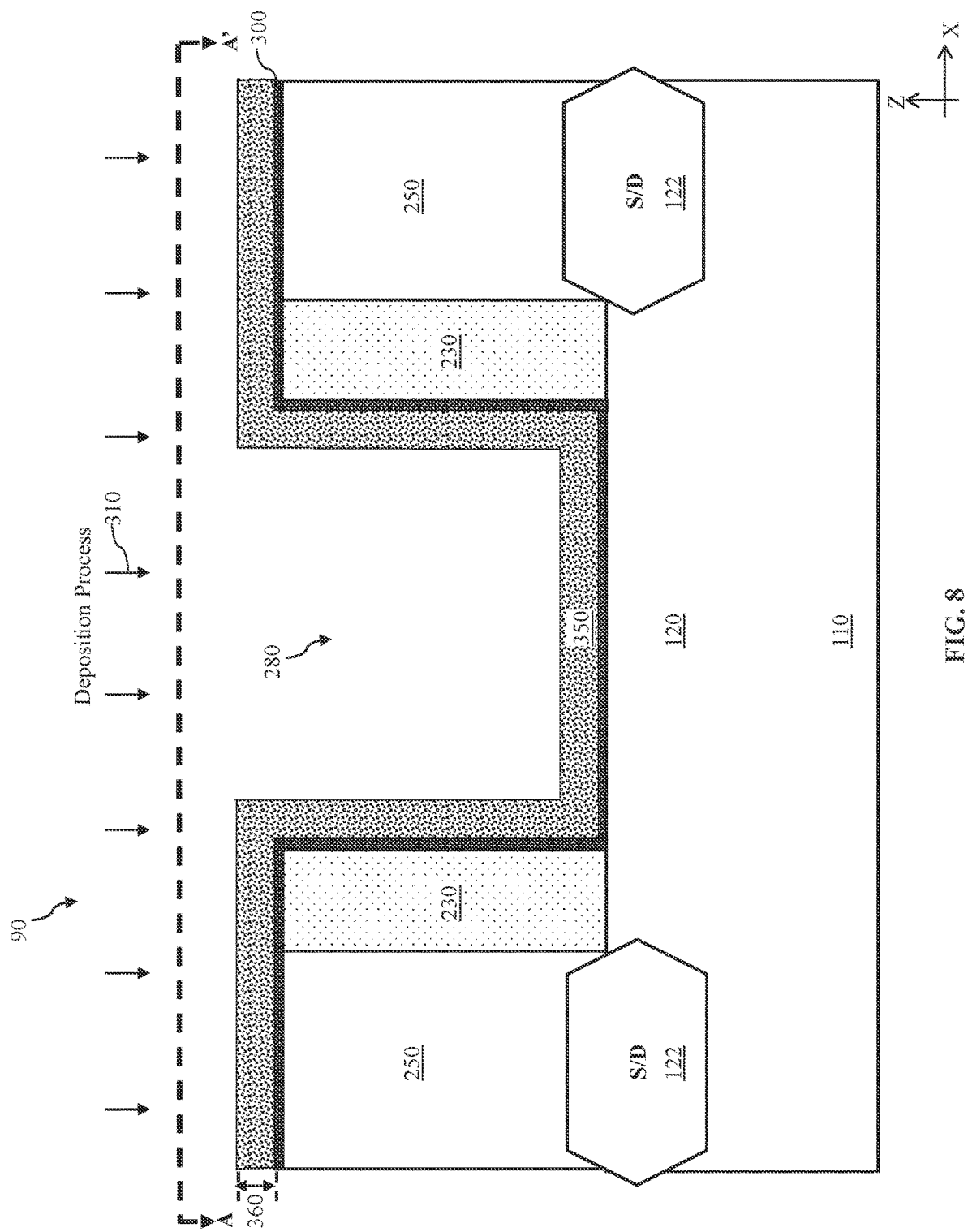
Figure 9:
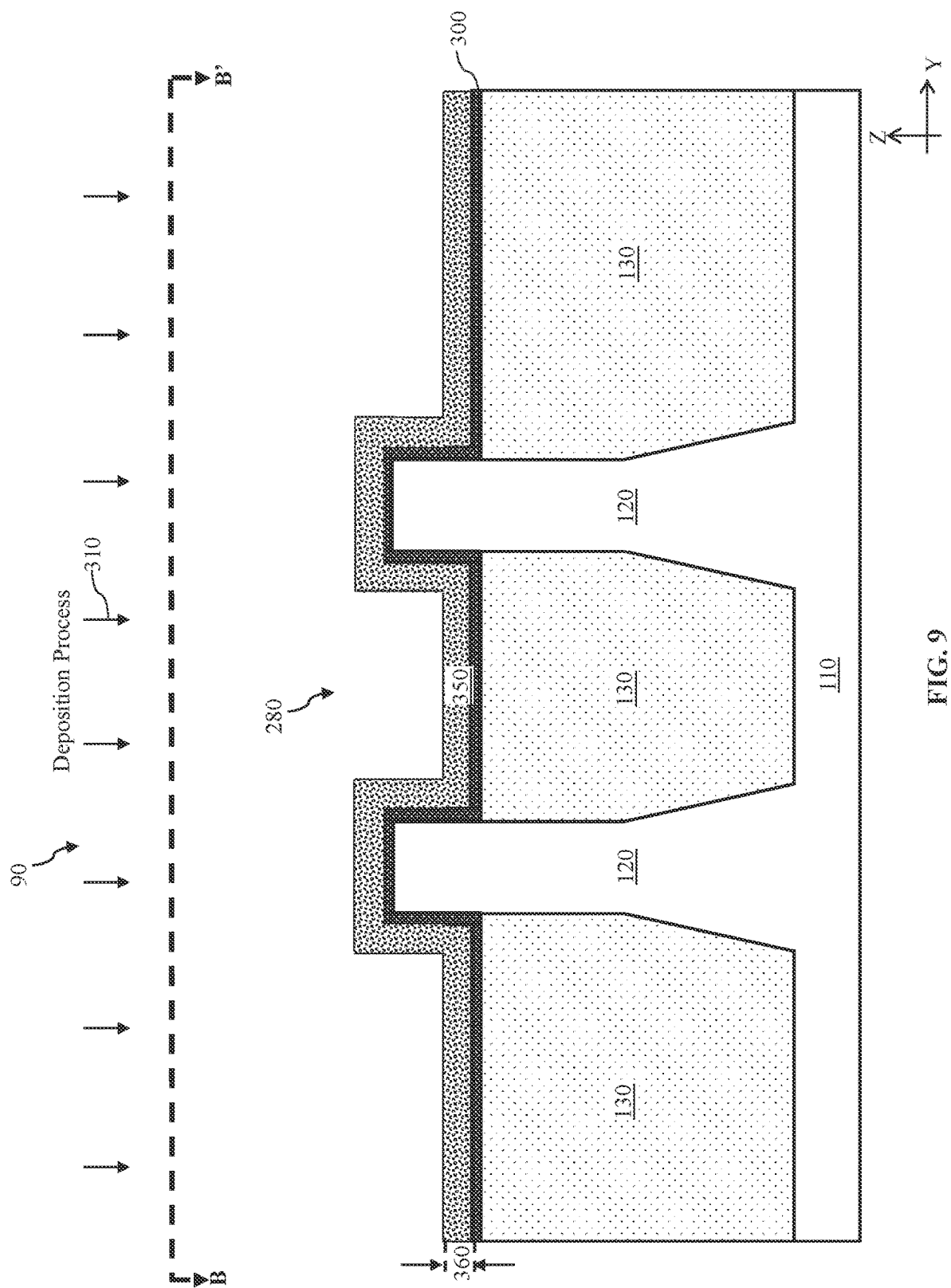

Referring now to FIGS. 8 and 9, a deposition process 310 is performed to the IC device 90 to form a gate dielectric layer 350 over the interfacial layer 300. The deposition process 290 may include an ALD process. The gate dielectric layer 350 includes a high-k dielectric material. High-k dielectric material generally refers to dielectric materials having dielectric constant that is greater than a dielectric constant of silicon oxide (which as a dielectric constant of about 3.9, or k≈3.9). In the illustrated embodiment, the high-k dielectric material of the gate dielectric layer 350 is hafnium oxide ($HfO_2$), which has a dielectric constant of about 22. Hafnium oxide is chosen as the material composition for the gate dielectric layer 350 at least in part due to its ability to form a good interface with the interfacial layer 300 below. In other words, the hafnium oxide material composition of the gate dielectric layer 350 allows it to have good integration with the interfacial layer 300, such that the interface is substantially free of defects. In addition, the hafnium oxide material composition of the gate dielectric layer 350 has a higher bandgap than most other types of high-k dielectric materials. Bandgap represents the minimum energy that is required to excite an electron up to a state in the conduction band where it can participate in conduction. As such, the hafnium oxide material composition allows the overall gate dielectric structure herein to achieve a reasonably high dielectric constant (and therefore helps reduce the equivalent oxide thickness) without causing excessive gate leakage, as gate leakage usually increases as the bandgap becomes lower.

The gate dielectric layer 350 is formed to have a thickness 360. The value of the thickness 360 may be flexibly configured by tuning the process parameters of the deposition process 310, for example by adjusting the process duration of the deposition process 310. In some embodiments, the thickness 360 is configured to be in a range between about 9 angstroms and about 14 angstroms. As will be discussed below in more detail, such a range of the thickness 360 is not randomly chosen, but rather it is specifically configured to optimize the performance of the IC device 90. For example, such a value range of the thickness 360 helps to optimize a tradeoff between gate leakage and effective gate thickness. If the thickness 360 is too high, then the overall dielectric constant of the gate may not be sufficiently high, which may degrade device performance such as speed. If the thickness 360 is too low, then the overall gate leakage may be too high, since the gate dielectric layer to be formed above the gate dielectric layer 350 will have a higher dielectric constant (and therefore higher gate leakage), as discussed below in more detail.

Figure 10:
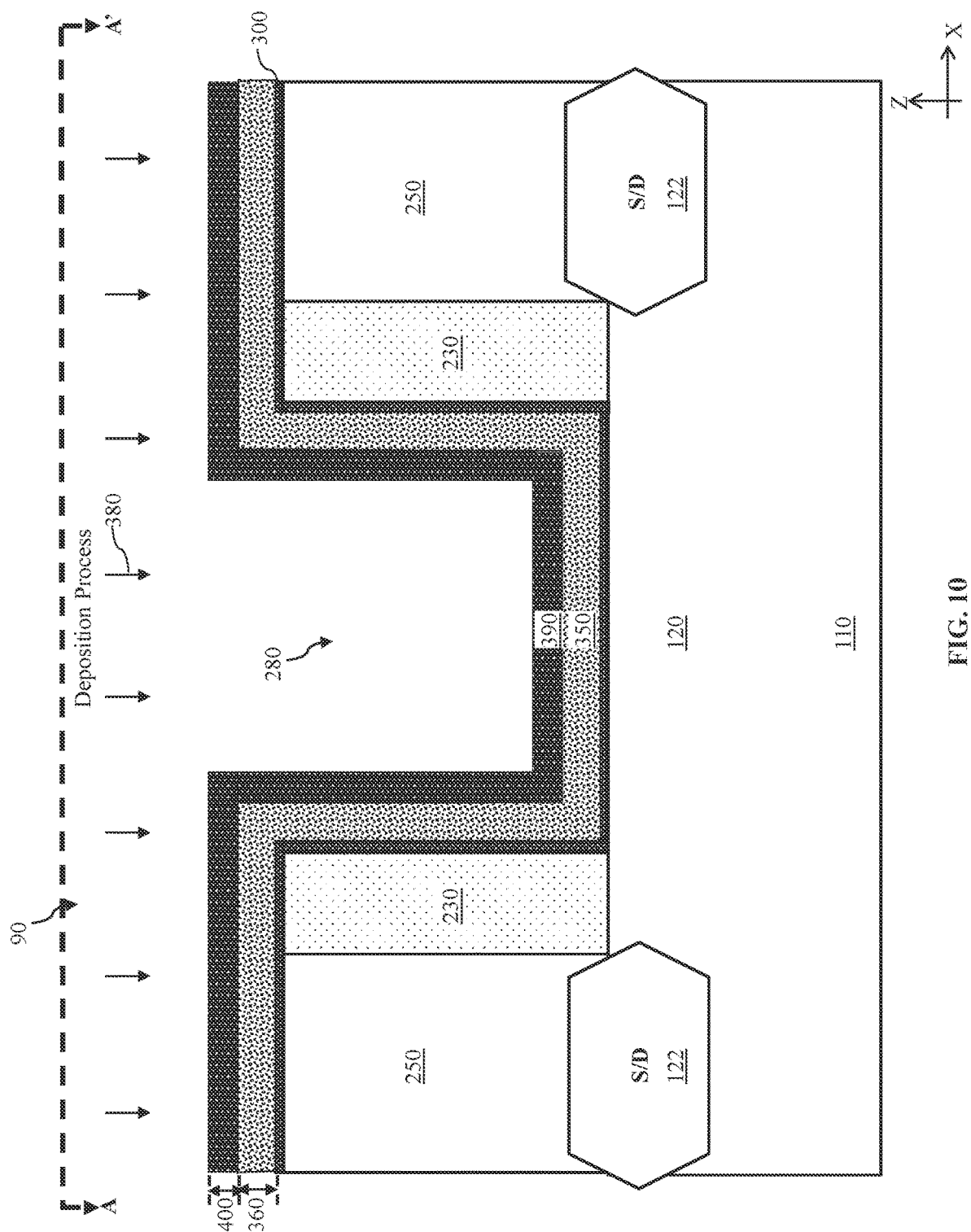
Figure 11:
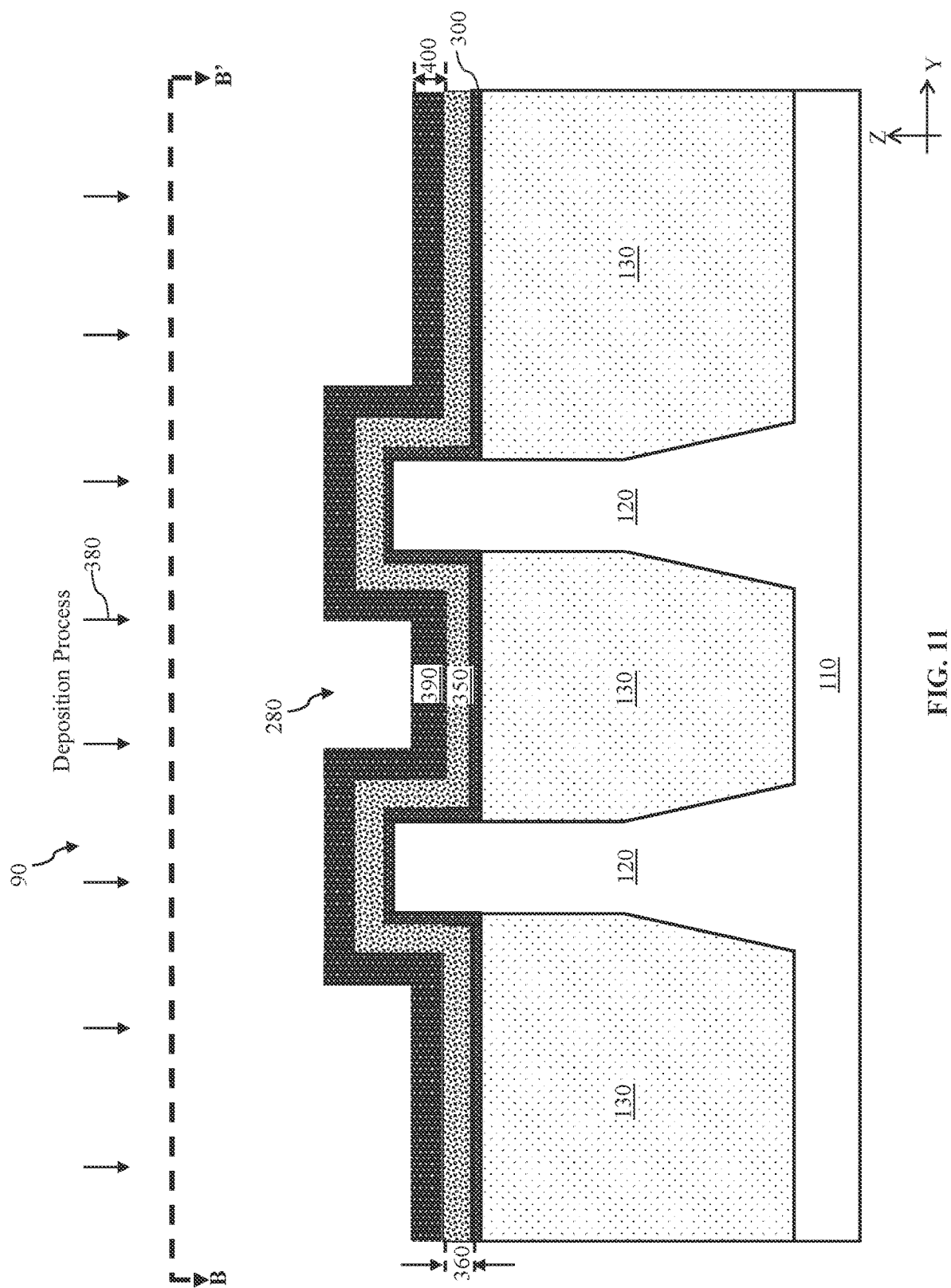

Referring now to FIGS. 10 and 11, a deposition process 380 is performed to the IC device 90 to form a gate dielectric layer 390 over the gate dielectric layer 350. The deposition process 380 may include another ALD process. In some embodiments, the ALD process of the deposition process 380 and the ALD process of the deposition process 290 may be performed within the same deposition chamber. The gate dielectric layer 390 includes another type of high-k dielectric material that is different from the high-k dielectric material of the gate dielectric layer 350. In other words, although both the gate dielectric layer 350 and the gate dielectric layer 390 may be high-k dielectric materials, they have different high-k material compositions. For example, the gate dielectric layer 390 has a greater dielectric constant than the gate dielectric layer 350. This allows the gate dielectric layer 390 to help raise the overall dielectric constant of the gate dielectric as a whole, which will achieve a lower equivalent oxide thickness without unduly increasing the overall thickness of the gate dielectric. With the greater dielectric constant, the IC device 90 may achieve a faster speed.

As another example, the gate dielectric layer 390 has fewer traps than the gate dielectric layer 350. Traps may be considered defects. Traps within a film may be induced by imperfect atom-to-atom bonding of the film. If the traps trap ion chargers (e.g., electrons or holes), it may have an adverse electrical impact on the mobility/speed, noise, and/or threshold voltage. Trap levels within a given material may be measures using various techniques, for example using a 1/f noise measurement method. Such techniques may be used to ascertain a material composition of a layer via a measurement of the trap level of such a layer. Have a lower level of traps allows the gate dielectric layer 390 to help reduce the noise introduced by the gate structure, which in turn helps to enlarge a circuit design window or shrink the chip area.

However, the higher dielectric constant of the gate dielectric layer 390 may have a lower bandgap, which as discussed above could lead to increased gate leakage. Therefore, the gate dielectric layer 390 should not be the sole gate dielectric layer of the gate structure. Instead, the gate dielectric layer 390 is used in conjunction with the gate dielectric layer 350 below to optimize the performance of the overall gate dielectric structure. In other words, the gate dielectric layer 350 and the gate dielectric layer 390 are selected or configured for different purposes or roles. As a bottom layer that is in direct physical contact with the interfacial layer 300 (and also closer to the channel region of the transistor), it is more important for the gate dielectric layer 350 to be able to form a good interface or have good integration with the interfacial layer 300 and the channel region therebelow. In comparison, as a top layer that is farther away from the interfacial layer 300 and the channel region of the transistor, whether the gate dielectric layer 390 can form a good interface with the interfacial layer is a smaller concern. Instead, it is more important for the gate dielectric layer 390 to have a greater dielectric constant (so as to raise the overall dielectric constant of the gate dielectric structure). The fewer traps of the gate dielectric layer 390 also helps to reduce the noise and may improve the speed and enlarge the circuit design window. The greater gate leakage associated with the higher dielectric constant of the gate dielectric layer 390 is offset by the lower gate leakage associated with the lower dielectric constant (but still greater than that of silicon oxide) of the gate dielectric layer 350 below.

In some embodiments, the gate dielectric layer 390 does not include hafnium oxide but rather may include zirconium oxide ($ZrO_x$), titanium oxide ($TiO_2$), lanthanum oxide ($La_2O_3$), or combinations thereof. Zirconium oxide has a dielectric constant of about 29, titanium oxide has a dielectric constant of about 80, and lanthanum oxide has a dielectric constant of about 30. In other words, all of these candidate materials of the gate dielectric layer 390 have dielectric constants that are not only greater than the dielectric constant of silicon oxide, but also greater than the dielectric constant of hafnium oxide, which is about 22. Again, such a high dielectric constant allows the gate dielectric layer 390 to raise the overall dielectric constant of the gate dielectric structure, thereby allowing a thinner equivalent oxide thickness and a faster speed to be achieved.

The gate dielectric layer 390 is formed to have a thickness 400. The value of the thickness 400 may be configured by tuning the process parameters of the deposition process 380, for example by tuning the process duration of the deposition process 380. According to embodiments of the present disclosure, the thickness 360 of the gate dielectric layer 350 is substantially greater than the thickness 400 of the gate dielectric layer 390. For example, in some embodiments, the thickness 360 is in a range between about 9 angstroms and about 14 angstroms, whereas the thickness 400 is in a range between about 2.5 angstroms and about 7 angstroms. In some embodiments, a ratio of the thickness 360 and the thickness 400 is in a range between about 1.3:1 and about 5.6:1. In some embodiments, the ratio of the thickness 360 and the thickness 400 is in a range between about 2:1 and about 3.6:1. Again, these ranges of the thickness 360 and the thickness 400 and their ratios are not randomly chosen, but rather specifically configured to optimize the performance of the IC device 90, so as to optimize the speed and/or gate leakage of the IC device 90 without compromising effective gate thickness. For example, if the gate dielectric layer 350 is too thick relative to the gate dielectric layer 390, the overall dielectric constant of the gate dielectric structure may not be sufficiently great to achieve a low equivalent oxide thickness, meaning that the gate structure may not be able to be scaled down as much as desired. On the other hand, if the gate dielectric layer 350 is too thin relative to the gate dielectric layer 390, then the gate leakage could be greater than desired, and/or the integration between the overall dielectric structure and the interfacial layer 300 may suffer. The ranges discussed above ensure that the gate dielectric structure can still have good integration with the layers below, while also being able to achieve a sufficient equivalent oxide thickness without having to make the gate dielectric thicker and without unduly increasing gate leakage.

Figure 12:
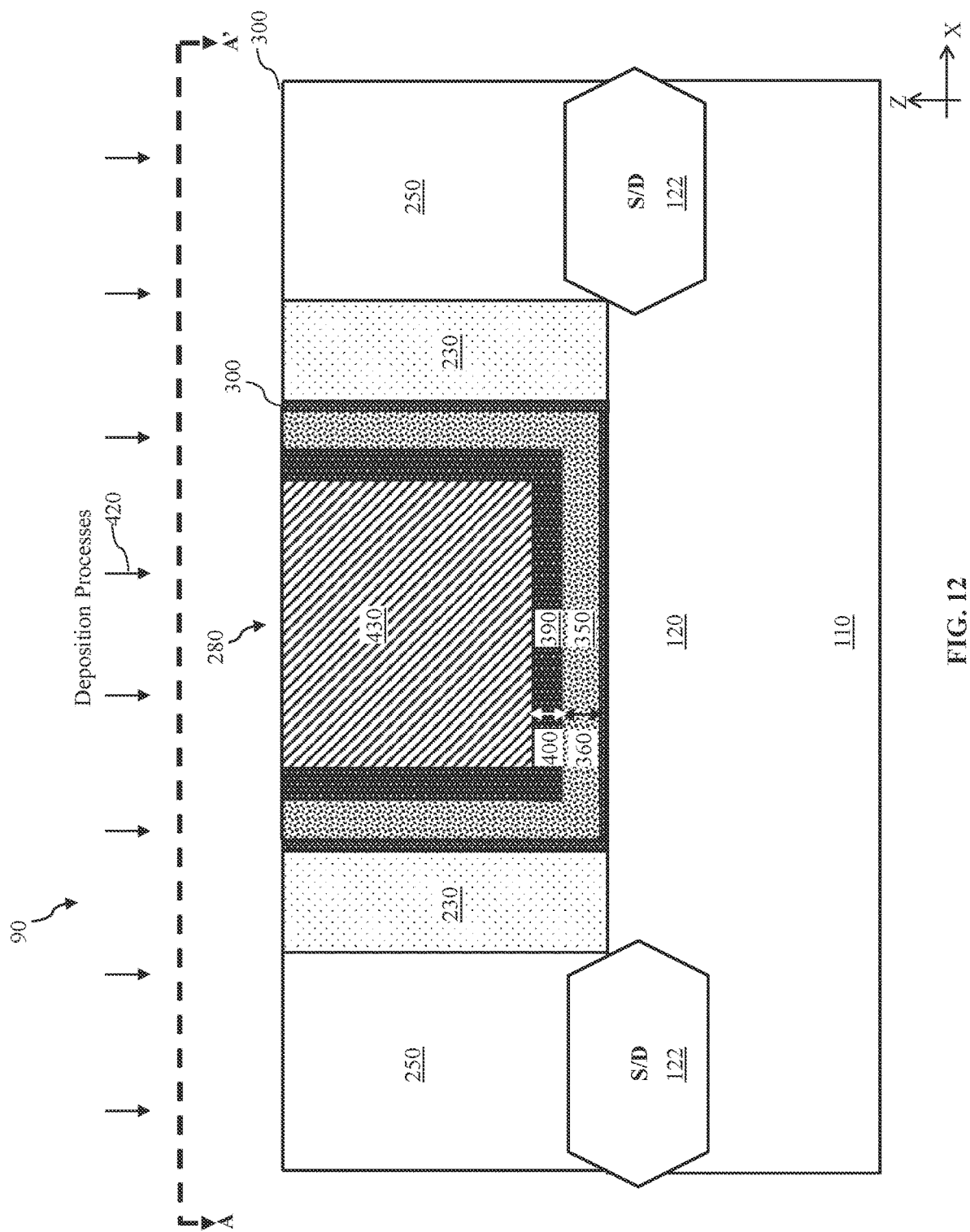
Figure 13:
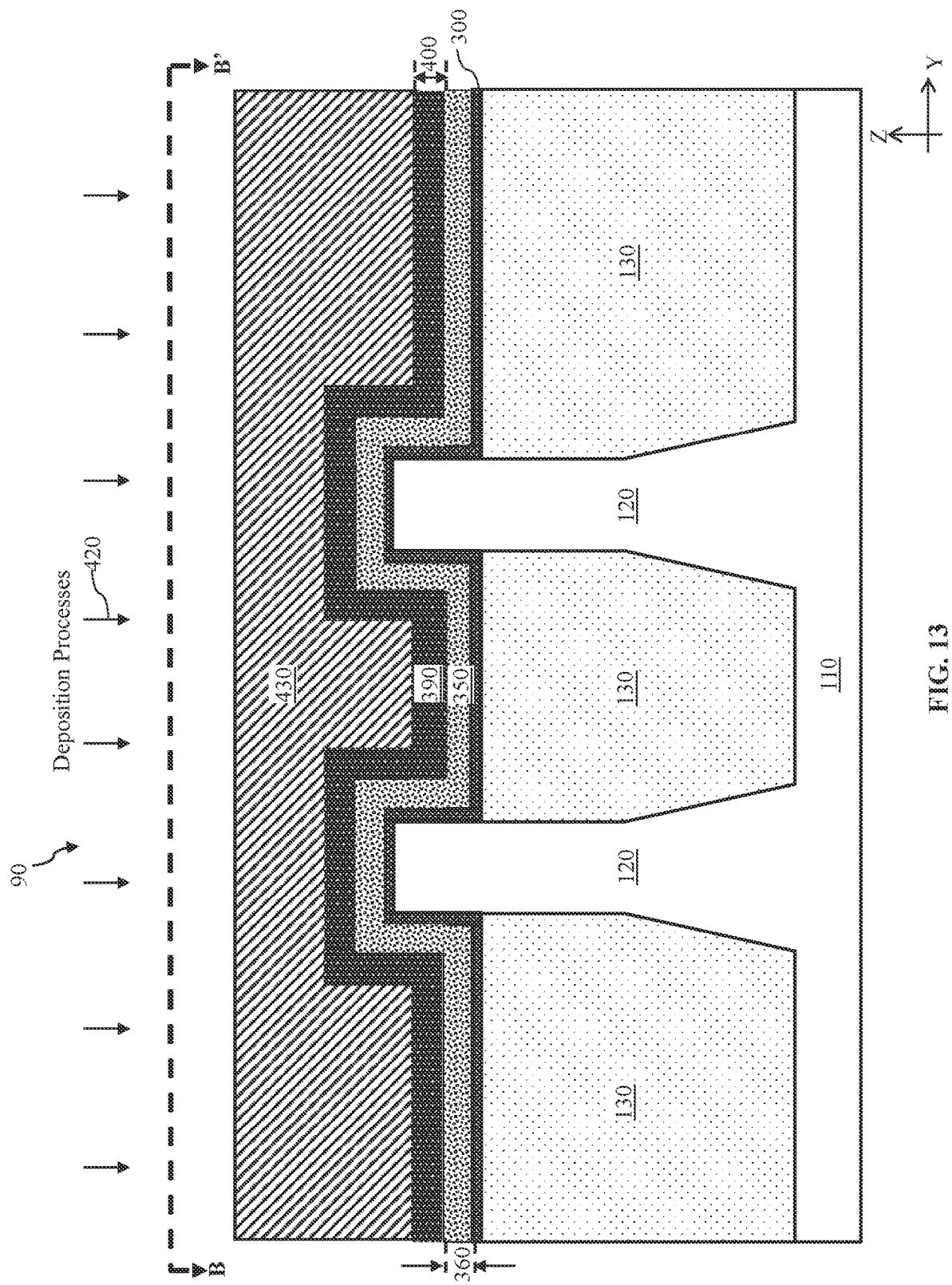

Referring now to FIGS. 12 and 13, one or more deposition processes 420 are performed to the IC device 90 to form gate electrodes 430 over the gate dielectric layer 390. The gate electrodes 430 contain metal and may include multiple layers, such as one or more capping layers, work function layers, glue/barrier layers, and/or metal fill (or bulk) layers. A capping layer can include a material that prevents and/or eliminates diffusion and/or reaction of constituents between the gate dielectric layers 350 and 390 and other layers of the gate electrodes 430. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer serves as the main conducting portion of the gate electrode 430 and can include a suitable conductive material, such as Al, W, and/or Cu. For reasons of simplicity, the various layers of the gate electrodes 430 are not illustrated herein in detail.

After all the layers of the gate electrodes 430 have been deposited, a planarization process such as a chemical mechanical polishing (CMP) process may be performed to the IC device 90. The planarization process may remove the excess portions of the interfacial layer 300, the gate dielectric layer 350, the gate dielectric layer 390, and the gate electrodes 430 outside the trenches 280, until the remaining portions of the interfacial layer 300, the gate dielectric layer 350, the gate dielectric layer 390, and the gate electrodes 430 have upper surfaces that are substantially co-planar (e.g., horizontally flat) with the ILD layers 250. At this stage of fabrication, HKMG structures are formed, which include the remaining portions of the interfacial layer 300, the gate dielectric layer 350, the gate dielectric layer 390, and the gate electrodes 430 that are filling the trenches 280.

It is understood that additional fabrication processes may be performed to complete the fabrication of the IC device 90. For example, a multi-layer interconnect (MLI) structure may be formed. The MLI structure electrically couples together various devices (for example, transistors, resistors, capacitors, and/or inductors) and/or components (for example, gate structures and/or source/drain features) of the IC device 90, such that the various devices and/or components operate as specified by design requirements of the IC device 90. The MLI structure may include a combination of dielectric layers and electrically conductive layers (for example, metal lines, vias, and contact) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines. Vertical interconnect features typically connect horizontal interconnect features in different layers (or different planes) of the MLI structure. During operation, the MLI structure routes signals between the devices and/or the components of the IC device 90 and/or distribute signals (for example, clock signals, voltage signals, and/or ground signals) to the devices and/or the components of the IC device 90.

Figure 14:
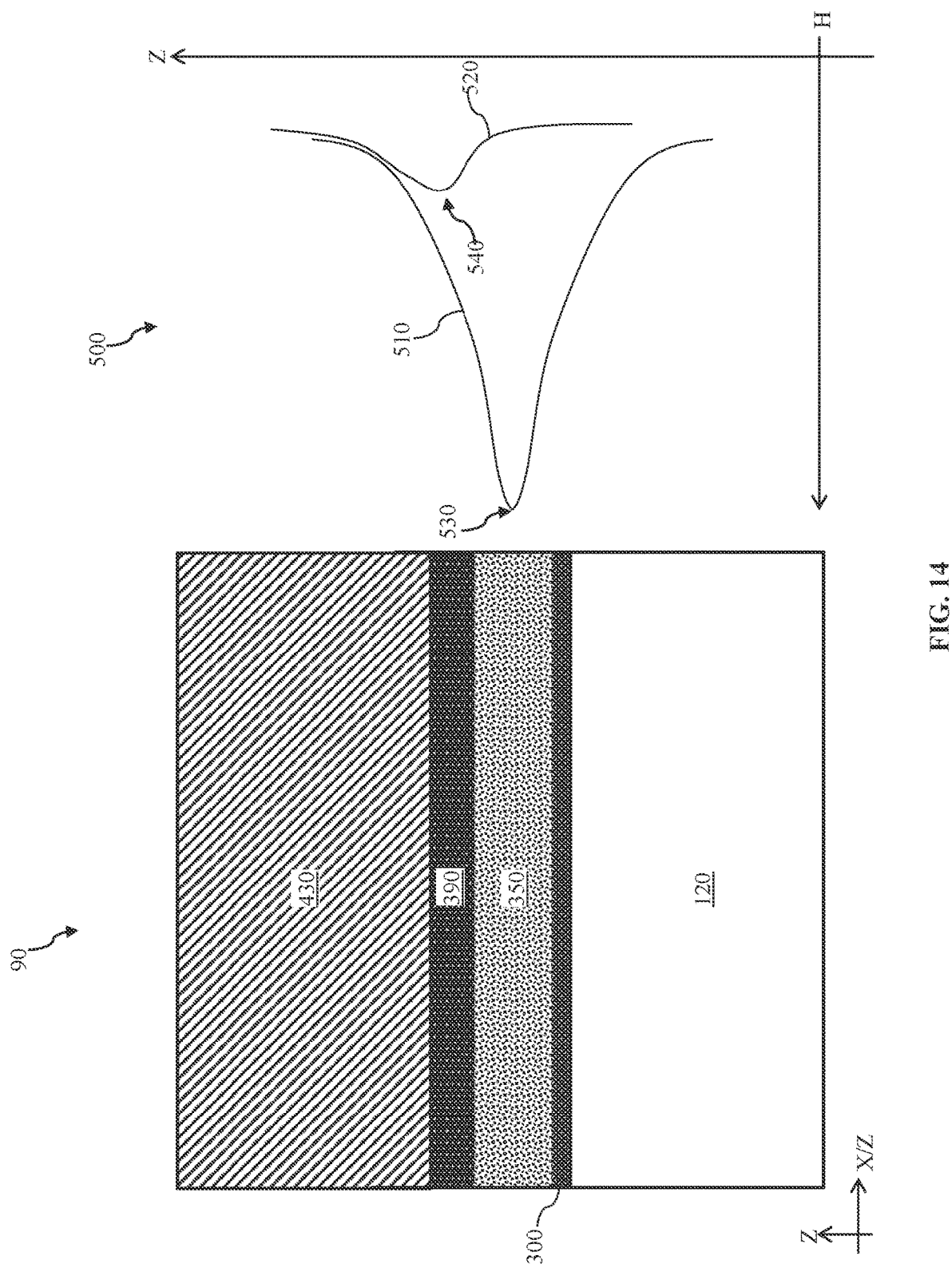
FIG. 14 is a cross-sectional view of a portion of an IC device and a graph indicating material concentration levels alongside the IC device according to various aspects of the present disclosure.

FIG. 14 illustrates a portion of the IC device 90 and a graph 500 that is displayed alongside of the portion of the IC device 90. In that regard, the portion of the IC device 90 displayed includes portions of the fin structure 120, the interfacial layer 300, the gate dielectric layer 350, the gate dielectric layer 390, and the gate electrode 430. The portion of the IC device 90 shown in FIG. 14 may also correspond to a cross-sectional view of the IC device 90, for example either the X-Z cross-sectional view or the Y-Z cross-sectional view.

Meanwhile, the graph 500 includes an H-axis as its horizontal axis and the Z-axis as its vertical axis. The Z-axis corresponds to the same Z-axis (or Z-direction) of the IC device 90. In other words, movements up and down the Z-axis in the graph 500 correspond to vertical movements up and down the IC device 90 (e.g., into and out of different layers). The H-axis represents a concentration level of a material. A movement to the "left" along the H-axis means an increase in the concentration level of the material, and a movement to the "right" along the H-axis means a decrease in the concentration level of the material.

The graph 500 includes a curve 510 and a curve 520. The curve 510 represents the concentration level of a material of the gate dielectric layer 350 as a function of its location along the Z-axis, and the curve 520 represents the concentration level of a material of the gate dielectric layer 390 as a function of its location along the Z-axis. For example, in an embodiment where the gate dielectric layer 350 has a hafnium oxide material composition, and the gate dielectric layer 390 has a zirconium oxide material composition (e.g., merely as a non-limiting example material of the layer 390), the curve 510 represents how the concentration level of hafnium oxide varies as a function of the vertical position inside the IC device 90 (i.e., up and down along the Z-axis), and the curve 520 represents how the concentration level of zirconium oxide varies as a function of the vertical position inside the IC device 90 (i.e., up and down along the Z-axis). It is understood that the vertical positions along the Z-axis of the graph 500 match the vertical positions along the Z-axis of the IC device 90 in FIG. 14. Also note that the hafnium oxide composition and the zirconium oxide composition for the layers 350 and 390 are merely non-limiting examples, and that other suitable materials may be used to implement the layer 350 and 390 in alternative embodiments.

Based on the graph 500, it can be seen that the concentration level of the material of the gate dielectric layer 350 (e.g., hafnium oxide) starts at a negligibly low level from the fin structures 120 (since the fin structures 120 do not or at least are not supposed to contain hafnium oxide) and gradually moves up into the interfacial layer 300, spikes sharply up into the gate dielectric layer 350 until reaching a peak level 530 near a midpoint of the gate dielectric layer 350, and then gradually ramps down afterwards. In some embodiments, the peak level 530 may be a function of the thickness of the layer 350. In other words, as the layer 350 becomes thicker, the peak level 530 may increase, and vice versa.

Meanwhile, the concentration level of the material of the gate dielectric layer 390 (e.g., zirconium oxide) also starts at a negligibly low level from the fin structures 120 (again, the fin structures 120 do not or at least are not supposed to zirconium oxide), remains relatively low into the interfacial layer 300 and the gate dielectric layer 350, and spikes up into the gate dielectric layer 390, until reaching a peak level 540 near a midpoint of the gate dielectric layer 390, and then gradually ramps down afterwards. In some embodiments, the peak level 540 may be a function of the thickness of the layer 390. In other words, as the layer 390 becomes thicker, the peak level 540 may increase, and vice versa. In some embodiments, a ratio of the peak level 530 and the peak level 540 is in a range between about 6:1 and about 22:1. It is understood that the ranges and ratios involving the peak level 530 and peak level 540 are not randomly chosen but rather are specifically configured to optimize the performance of the IC device 90. For example, these ranges and ratios allow the gate dielectric layer 350 to effectively form a good interface with the interfacial layer 300 below, and at the same time, allow the gate dielectric layer 390 to raise the overall dielectric constant of the gate dielectric structure without contributing too much to gate leakage.

The graph 500 may also reflect the conditions or characteristics of the IC device 90 in an example real world environment. For example, although the figures discussed above illustrate a distinct boundary between the gate dielectric layer 350 and the gate dielectric layer 390, the IC device 90 in the real world may lack such a distinct boundary. Instead, the materials of the gate dielectric layers 350 and 390 may somewhat merge or diffuse into each other, thereby making any boundary between the two layers hard to identify. However, using machines such as Transmission Electron Microscopy (TEM) tools and/or Energy Dispersive X-ray Spectroscopy (EDS or EDX) tools, the concentration levels of the different materials of the gate dielectric layer 350 and the gate dielectric layer 390 may be identified as a function of the vertical position within the IC device 90. As such, by using the TEM tools or the EDS tools to reverse engineer an IC device, one may determine that an IC device has implemented a multi-layer gate dielectric scheme similar to the embodiments of the present disclosure.

Figure 15:
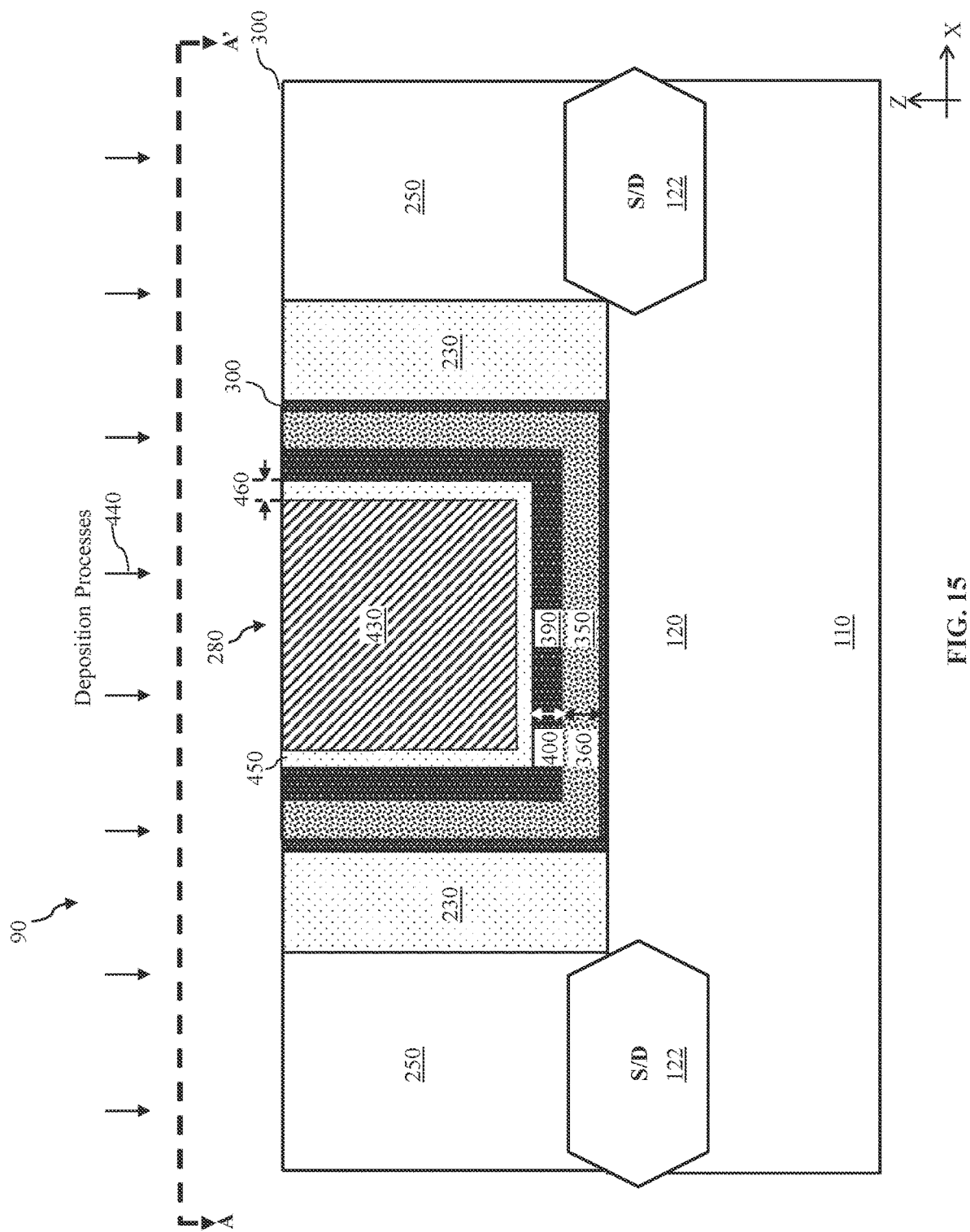
FIGS. 15-16 are cross-sectional views of an IC device at a stage of fabrication according to various aspects of the present disclosure.
Figure 16:
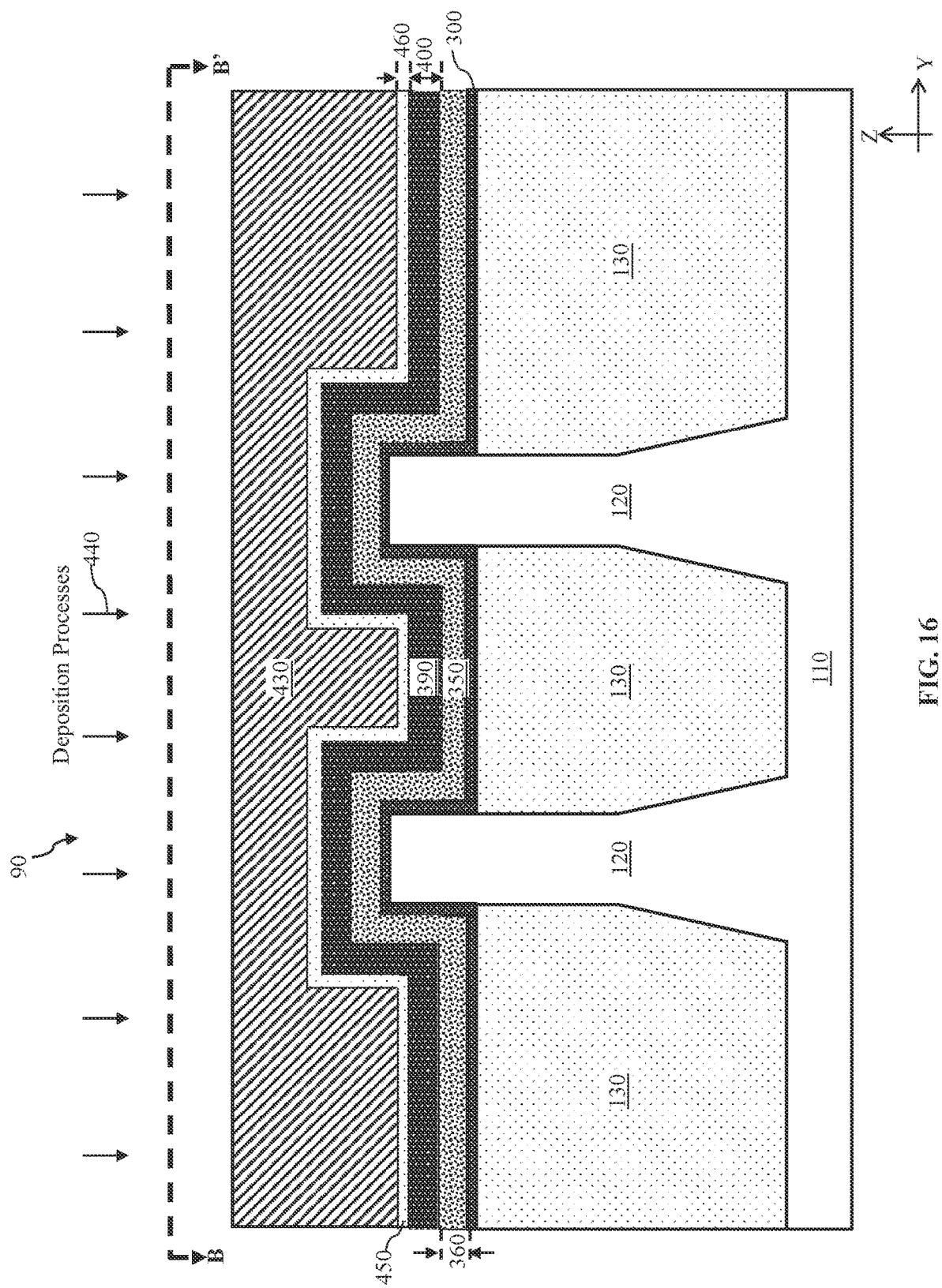

The above discussions pertain to a dual-layer gate dielectric scheme. However, the concepts of the present disclosure may apply to a tri-layer gate dielectric as well. One embodiment of the tri-layer gate dielectric scheme is illustrated in FIGS. 15-16, which are also cross-sectional views of the IC device in the X-Z plane and in the Y-Z plane, respectively. For reasons of consistency and clarity, similar components appearing in FIGS. 2-14 and 15-16 will be labeled the same.

The stage of fabrication shown in FIGS. 15-16 is the same stage of fabrication shown in FIGS. 12-13. In addition to the gate dielectric layers 350 and 390, the gate dielectric structure in this embodiment also includes a gate dielectric layer 450 that is formed by a deposition process 440, for example an ALD process. The gate dielectric layer 450 is formed directly on the gate dielectric layer 390 and directly below the gate electrode 430. The gate dielectric layer 450 has a different material composition than the gate dielectric layers 350 and 390. In more detail, whereas the gate dielectric layer 350 is configured to form a good interface with the interfacial layer 300 or have good integration with the channel below, and the gate dielectric layer 390 is configured to raise the overall dielectric constant of the gate structure and to reduce noise, the gate dielectric layer 450 is configured to facilitate the gate electrode 430 in tuning the threshold voltage. For example, the material composition of the gate dielectric layer 450 is selected to assist the work function metal layers of the gate electrode 430 in tuning threshold voltage. In some embodiments, the gate dielectric layer 350 has a hafnium oxide material composition, the gate dielectric layer 390 has a zirconium oxide material composition, and the gate dielectric layer 450 has an aluminum oxide ($Al_2O_3$) material composition or a lanthanum oxide ($La_2O_3$) material composition.

The gate dielectric layer 450 is formed to have a thickness 460. The thickness 460 is less than the thickness 400 of the gate dielectric layer 390 and less than the thickness 360 of the gate dielectric layer 350. Again, the thickness 460 can be configured by adjusting the process parameters (e.g., deposition duration) of the deposition process 440. In some embodiments, the thickness 460 is configured to be in a range between about 1.5 angstroms and about 2.5 angstroms, a ratio between the thickness 360 and the thickness 460 is in a range between about 5:1 and about 10:1, and a ratio between the thickness 400 and the thickness 460 is in a range between about 1:1 and about 4:1. These ranges and ratios are not randomly chosen but specifically configured to ensure that the gate dielectric layer 450 can adequately assist in the threshold voltage tuning, without degrading the gate dielectric constant or the noise level. Therefore, each of the gate dielectric layers 350, 390 and 450 can adequately and efficiently serve their respective roles, for example forming a good interface with the interfacial layer 300, raising the overall dielectric constant of the gate structure and reducing noise, and facilitating the tuning of the threshold voltage, respectively.

Figure 17:
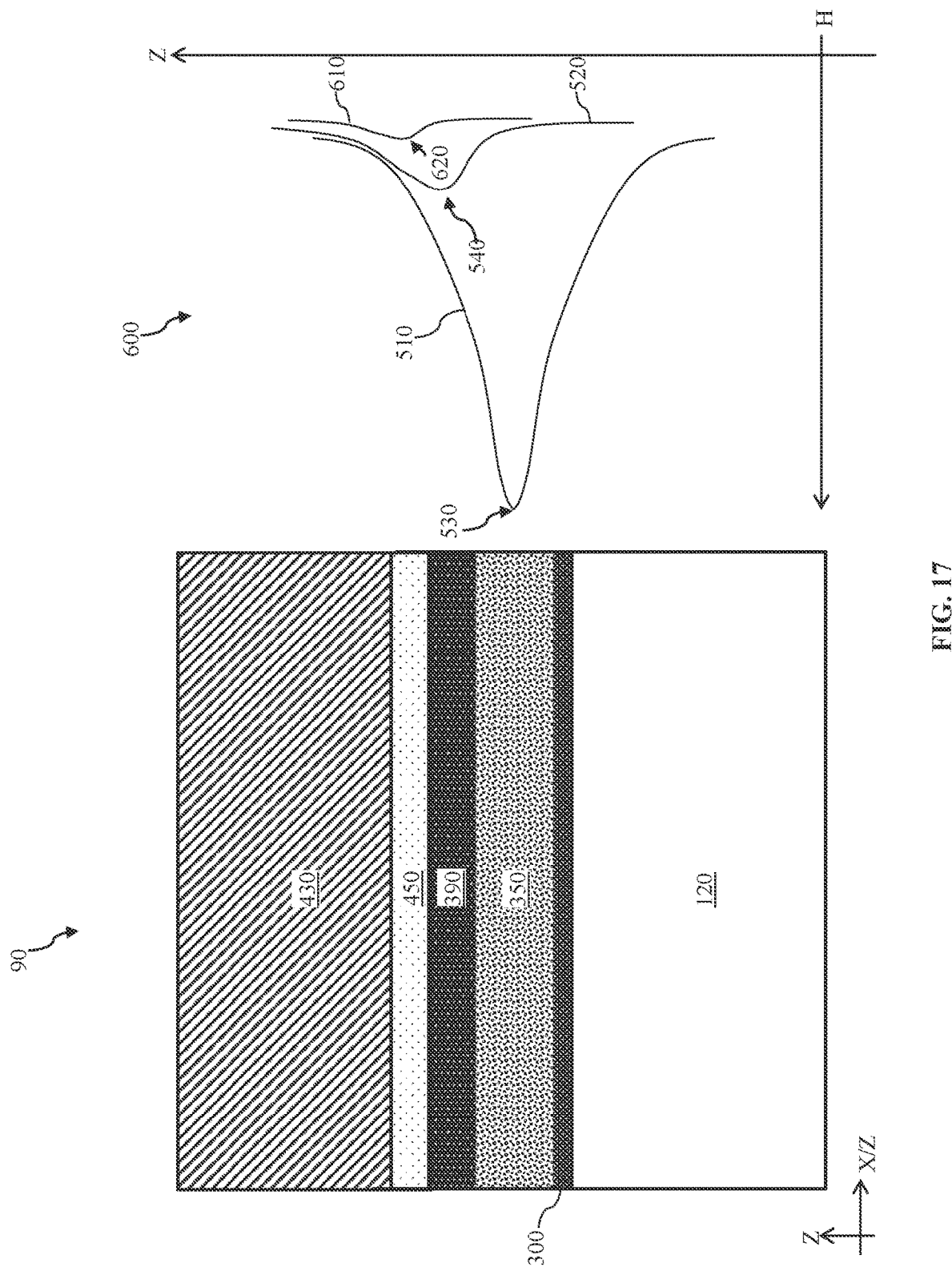
FIG. 17 is a cross-sectional view of a portion of an IC device and a graph indicating material concentration levels alongside the IC device according to various aspects of the present disclosure.

FIG. 17 illustrates a portion of the IC device 90 and a graph 600 that is displayed alongside of the portion of the IC device 90. Whereas the graph 500 in FIG. 14 corresponds to the dual-layer gate dielectric embodiment discussed above with reference to FIGS. 2-13, the graph 600 corresponds to the tri-layer gate dielectric embodiment discussed above with reference to FIGS. 15-16. For reasons of simplicity, similar components appearing in FIG. 14 will be labeled the same in FIG. 17.

Like the graph 500, the graph 600 also includes the curve 510 and the curve 520 that represent the variations of the concentration levels of the gate dielectric layer 350 and the gate dielectric layer 390 along the vertical axis Z. The graph 600 further includes a curve 610 that represents the variation of the concentration levels of the gate dielectric layer 450 along the vertical axis Z.

The curve 610 indicates that the concentration level of the material of the gate dielectric layer 450 (e.g., aluminum oxide or lanthanum oxide) also starts at a negligibly low level from the fin structures 120 (again, the fin structures 120 do not or at least are not supposed to contain aluminum oxide or lanthanum oxide), remains relatively low into the interfacial layer 300 and the gate dielectric layers 350 and 390, and spikes up into the gate dielectric layer 450, until reaching a peak level 620 near a midpoint of the gate dielectric layer 450, and then gradually ramps down afterwards. Again, the peak level 620 may be a function of the thickness of the gate dielectric layer. The peak level 620 is less than the peak levels 540 and 530. In some embodiments, a ratio of the peak level 620 and the peak level 530 is in a range between about 1:19 and about 1:40. It is understood that the ranges and ratios involving the peak levels 620 and peak level 530 are not randomly chosen but rather are specifically configured to optimize the performance of the IC device 90. For example, these ranges and ratios allow the gate dielectric layer 450 to be thick enough to adequately assist the work function metal in the tuning of the threshold voltage, but not too thick to lower the dielectric constant of the overall gate dielectric structure too much or introduce too much noise.

The multi-layer gate dielectric structure of the present disclosure may be applied to various types of IC applications. For example, a multi-layer gate dielectric structure may be implemented in a static random access memory (SRAM) device. An SRAM device is a type of semiconductor memory that uses bi-stable latching circuitry (e.g., flip-flop) to store binary bits of information. A typical SRAM cell may include pull-up (PU) transistors, pull-down (PD) transistors, and pass-gate (PG) transistors. As semiconductor technology nodes continue to advance to smaller generations (e.g., smaller than the 10-nanometer node), the SRAM write and read margins may become more important. An alpha ratio of the SRAM—defined as PU's $Id_{sat}$ (saturation current) divided by PG's $Id_{sat}$—may be tuned to achieve the desired write and/or read margin of the SRAM. Since $Id_{sat}$ is an inverse function of a threshold voltage (Vt), the threshold voltage may be tuned to arrive at the desired $Id_{sat}$.

Figure 18:
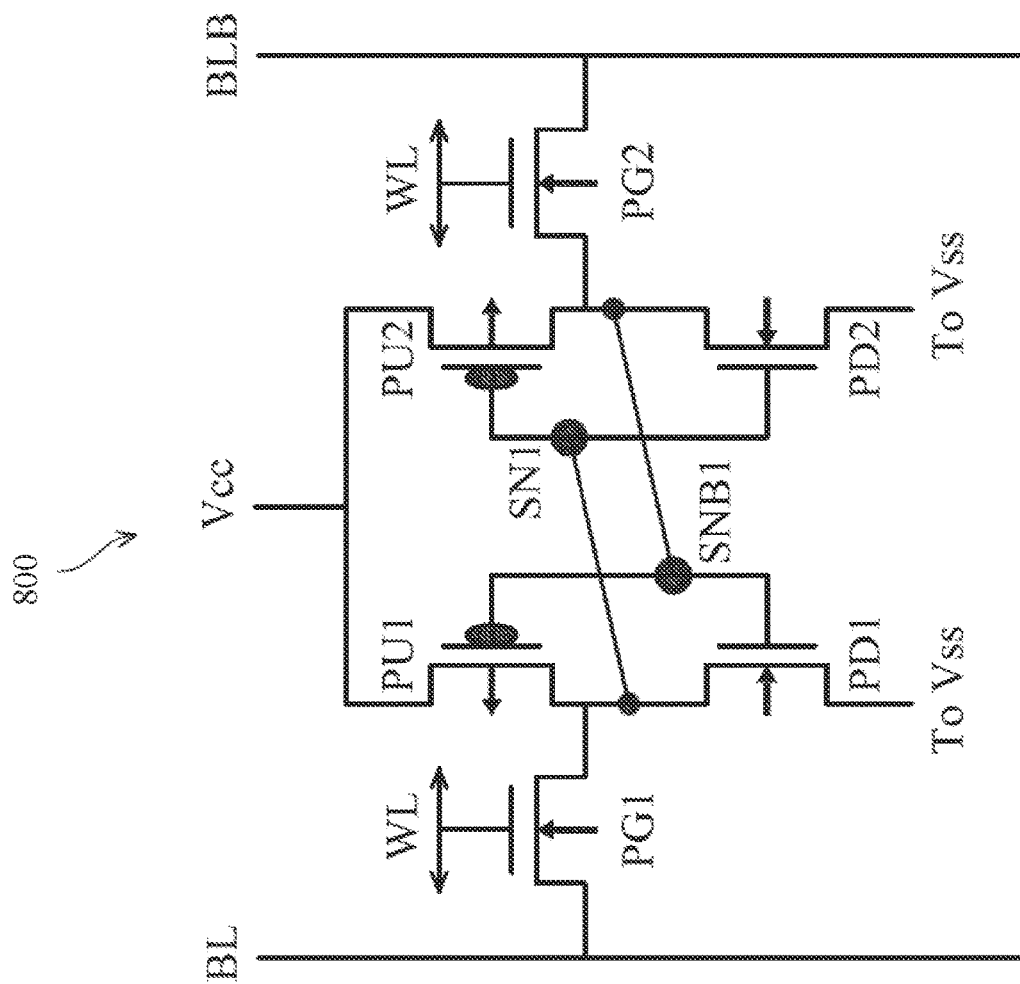
FIG. 18 is a schematic of an SRAM circuit cell according to various aspects of the present disclosure.

FIG. 18 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

Again, according to various aspects of the present disclosure, each of the transistors PU1, PU2, PD1, PD2, PG1, and PG2 may be implemented with a dual-layer or a tri-layer gate dielectric structure discussed above. Doing so will improve the gate leakage issues and also the performance of the SRAM device, for example with respect to speed and power dissipation. It is also understood that although SRAM devices are used as a non-limiting example for IC applications that could implement the various aspects of the present disclosure, other types of IC applications may also implement the various aspects of the present disclosure. For example, the multi-layer gate dielectric scheme herein may be applied to periphery logic circuit devices in an SRAM device (such as row decoder, column decoder, read/write circuitry), or other circuit devices such as ring oscillators, radio frequency (RF) devices, amplifiers, mixers, analog-to-digital converters (ADCs), digital-to-analog converters (DACs), and the like.

Figure 19:
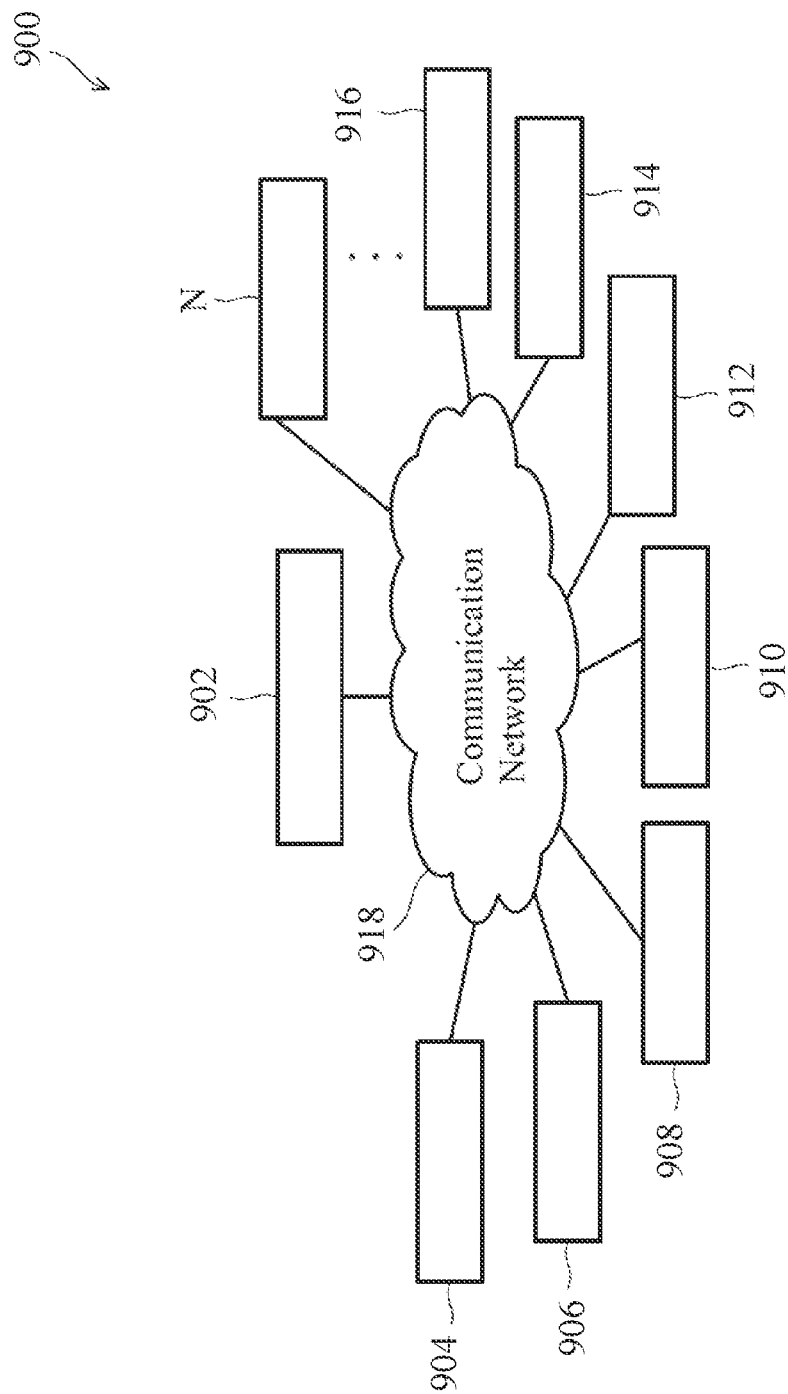
FIG. 19 is a block diagram of a semiconductor fabrication system according to various aspects of the present disclosure.

FIG. 19 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 20:
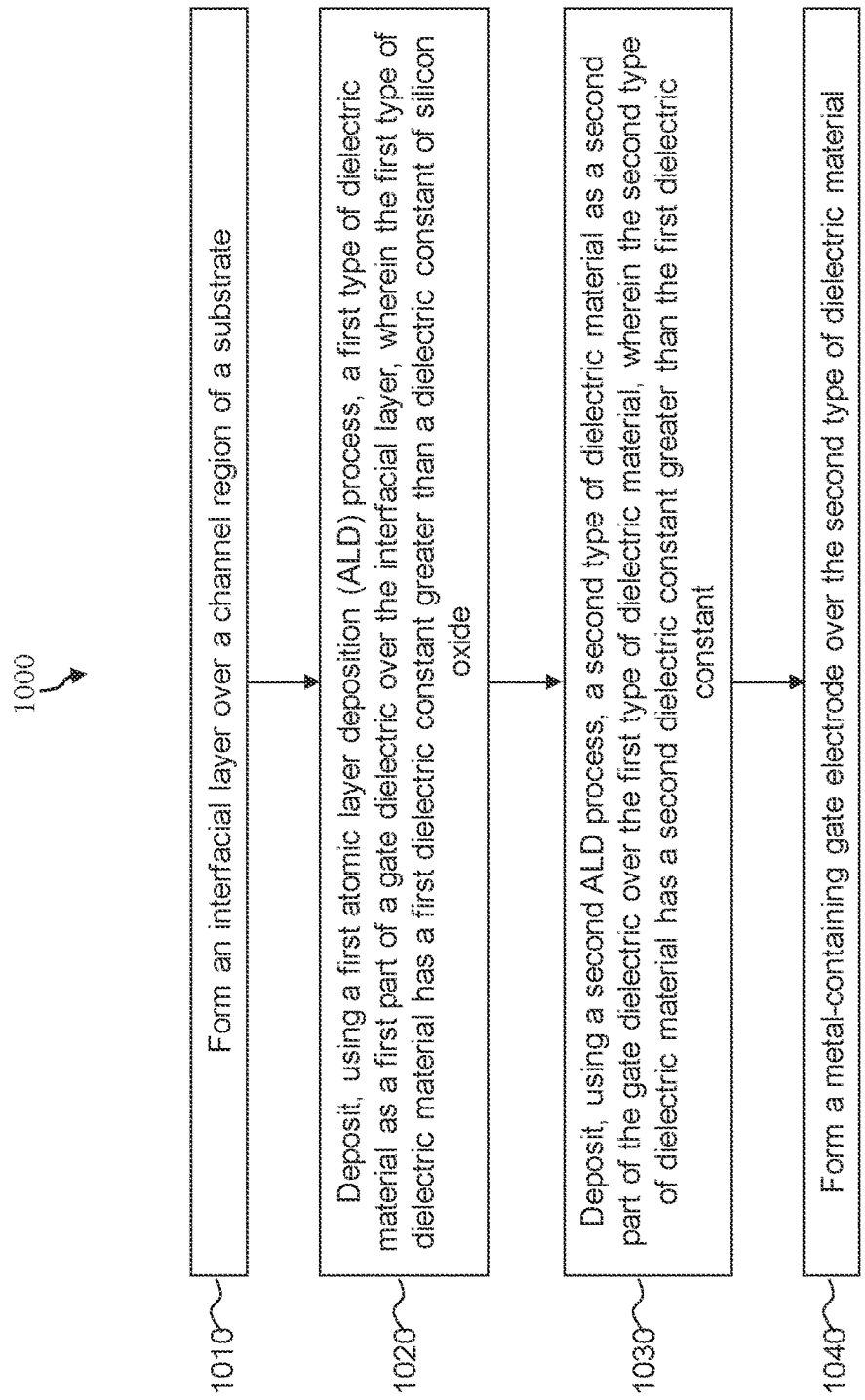
FIG. 20 is a flowchart of a method of fabricating a semiconductor device according to various aspects of the present disclosure.

FIG. 20 is a flowchart illustrating a method 1000 of fabricating a semiconductor device according to another embodiment of the present disclosure. The method 1000 includes a step 1010 of forming an interfacial layer over a channel region of a substrate.

The method 1000 includes a step 1020 of depositing, using a first atomic layer deposition (ALD) process, a first type of dielectric material as a first part of a gate dielectric over the interfacial layer. The first type of dielectric material has a first dielectric constant greater than a dielectric constant of silicon oxide.

The method 1000 includes a step 1030 of depositing, using a second ALD process, a second type of dielectric material as a second part of the gate dielectric over the first type of dielectric material. The second type of dielectric material has a second dielectric constant greater than the first dielectric constant.

The method 1000 includes a step 1040 of forming a metal-containing gate electrode over the second type of dielectric material.

In some embodiments, the first ALD process and the second ALD process are performed in a same ALD chamber, and the first ALD process is performed with a longer process duration than the second ALD process. In some embodiments, a process duration of the first ALD and the second ALD process is configured such that the first type of dielectric material is thicker than the second type of dielectric material by a factor of between about 1.3 times and about 5.6 times.

In some embodiments, the forming the metal-containing gate electrode comprises: depositing a work function metal component of a gate electrode directly on the second type of dielectric material, as well as depositing a fill metal component of the gate electrode over the work function metal component.

It is understood that additional steps may be performed before, during, or after the steps 1010-1040. For example, after the second ALD process has been performed but before the metal-containing gate electrode is formed, the method may include a step of: depositing, via a third ALD process, a third type of dielectric material as a third part of the gate dielectric over the second type of dielectric material. The third type of dielectric material is different from the first type of dielectric material and the second type of dielectric material. In some embodiments, the depositing the first type of dielectric material comprises depositing hafnium oxide directly on an upper surface of the interfacial layer. In some embodiments, the depositing the second type of dielectric material comprises depositing zirconium oxide directly on an upper surface of the first type of dielectric material. In some embodiments, the depositing the third type of dielectric material comprises depositing lanthanum oxide or aluminum oxide directly on an upper surface of the second type of dielectric material. Additional steps may include the formation of additional interconnect features, packaging, or testing processes.

In summary, the present disclosure involves forming a multi-layer gate dielectric structure, rather than a single layer gate dielectric structure. The multi-layer gate dielectric structure implements different types of materials for each of the gate dielectric layers, where each type of material (and their respective thicknesses) is selected to achieve a specific goal. For example, in a dual-layer gate dielectric scheme, the bottom gate dielectric layer has a material and thickness configured to form a good interface and/or integration with the interfacial layer and/or the channel below, and the top gate dielectric layer has a material and thickness configured to raise the overall dielectric constant and to reduce the noise level. In a tri-layer gate dielectric scheme, the bottom gate dielectric layer has a material and thickness configured to form a good interface and/or integration with the interfacial layer and/or the channel below, the middle gate dielectric layer has a material and thickness configured to raise the overall dielectric constant and to reduce the noise level, and the top gate dielectric layer has a material and thickness configured to facilitate the tuning of threshold voltage.

Based on the above discussions, it can be seen that the present disclosure offers advantages over conventional source/drain vias. However, it is understood that not all advantages are discussed herein, different embodiments may offer different advantages, and that no particular advantage is required for any embodiment. One advantage is that the present disclosure allows the scaling down process to continue. Conventional single-layer gate dielectric structures may become unfeasible or may suffer from performance degradations as the device scaling reaches the 7-nm technology node or beyond. For example, when the gate dielectric is implemented using a silicon oxide material, the gate dielectric would have to be very thin. On the other hand, when the gate dielectric is implemented using a high-k material such as hafnium oxide, it may not achieve the high dielectric constant needed to meet the performance requirements such as speed. When the gate dielectric is implemented using a high-k material having a dielectric constant even greater than that of hafnium oxide, the lower bandgap associated with such high-k dielectric materials may cause excessive gate leakage, which increases power consumption and degrades reliability of the IC device.

In comparison, the multi-layer gate dielectric scheme utilizes multiple gate dielectric layers to achieve different objectives simultaneously. In some embodiments, a bottom layer of the gate dielectric structure is configured to form a good interface and/or have good integration with the layers below (e.g., interfacial layer or channel), so as to prevent the formation of defects at the bottom of the gate dielectric. The bottom layer also has a relatively high bandgap among high-k dielectric materials, which helps to reduce gate leakage. Meanwhile, the top layer (in a dual-layer gate dielectric scheme) or the middle layer (in a tri-layer gate dielectric scheme) has a different material composition than the bottom layer, for example it may have a material composition that is associated with a greater dielectric constant and/or fewer traps than the bottom layer. As such, the top/middle layer can raise the overall dielectric constant of the gate dielectric structure, which allows the gate dielectric structure to achieving a thin thickness that is required for advanced technology nodes. The high-k dielectric constant helps increase the speed of the IC device. The fewer traps of the middle layer also helps to reduce the noise level, which enlarges the circuit design window and also allows the chip area to be shrunk. Furthermore, in the tri-layer scheme where a top layer is implemented, such a top layer has a material composition specifically configured to allow it to facilitate the gate electrode in the tuning of the threshold voltage. Based on the above, the multi-layer gate dielectric structure can achieve a low equivalent oxide thickness while still remaining thin, and it also reduces gate leakage (or at least not increase it) and improves device performance such as speed, power dissipation, noise, and reliability. Other advantages may include compatibility with existing fabrication processes and the ease and low cost of implementation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

It is also understood that the multi-layer gate dielectric structures of the present disclosure discussed above may also apply to multi-channel devices such as Gate-All-Around (GAA) devices. In that regard, GAA devices have fin structures like the ones discussed above, and they have multi-channel structures such as stacks of nano-sheets, nano-wires, or nano-tubes that are formed over fin structures and are wrapped around by the gate. Gate dielectric structures (e.g., dual-layer or tri-layer structures) may circumferentially surround each of the channels (e.g., in the form of a nano-structure such as a nano-sheet or nano-wire) in 360 degrees. Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

One aspect of the present disclosure pertains to a semiconductor device. The semiconductor device includes a substrate. A first gate dielectric layer is disposed over the substrate. The first gate dielectric layer has a first material composition. A second gate dielectric layer is disposed over the first gate dielectric layer. The second gate dielectric layer has a second material composition. The first material composition is different from the second material composition. The first material composition and the second material composition each have greater dielectric constants than a dielectric constant of silicon oxide.

One aspect of the present disclosure pertains to a semiconductor device. The semiconductor device includes a source region and a drain region disposed in a substrate, a channel region disposed between the source region and the drain region, and a gate structure disposed over the channel region. The gate structure includes a gate dielectric component and a metal-containing gate electrode component. The gate dielectric component includes a plurality of different dielectric layers each having a greater dielectric constant than a dielectric constant of silicon oxide. The different dielectric layers have different dielectric constants from one another.

Yet another aspect of the present disclosure pertains to a method of fabricating a semiconductor device. An interfacial layer is formed over a channel region of a substrate. Using a first atomic layer deposition (ALD) process, a first type of dielectric material is deposited as a first part of a gate dielectric over the interfacial layer. The first type of dielectric material has a first dielectric constant greater than a dielectric constant of silicon oxide. Using a second ALD process, a second type of dielectric material is deposited as a second part of the gate dielectric over the first type of dielectric material. The second type of dielectric material has a second dielectric constant greater than the first dielectric constant. A metal-containing gate electrode is formed over the second type of dielectric material.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first gate dielectric layer directly on an upper surface of an interfacial layer in a vertical direction, the interfacial layer being disposed over an active region, wherein the first gate dielectric layer has a first material composition that contains hafnium oxide and has a first thickness;
   forming a second gate dielectric layer over the first gate dielectric layer such that a bottom surface of the second gate dielectric layer is formed directly on an upper surface of the first gate dielectric layer, wherein the second gate dielectric layer has a second material composition that contains zirconium oxide, titanium oxide, or lanthanum oxide and has a second thickness, wherein the second material composition and the first material composition are both different from a third material composition of the interfacial layer on which the first gate dielectric layer is formed directly, and wherein the forming the first gate dielectric layer and the forming the second gate dielectric layer is performed such that a ratio of the first thickness and the second thickness is in a range between about 2:1 and about 3.6:1; and forming a metal-containing gate electrode directly on an upper surface and side surfaces of the second gate dielectric layer.

2. The method of claim 1, wherein:
the forming the first gate dielectric layer is performed using a first atomic layer deposition (ALD) process; and
the forming the second gate dielectric layer is performed using a second ALD process.

3. The method of claim 2, wherein the first ALD process and the second ALD process are performed in a same deposition chamber.

4. The method of claim 1, wherein the forming the first gate dielectric layer and the forming the second gate dielectric layer are performed as a part of a fabrication of a Static Random Access Memory (SRAM) device.

5. The method of claim 1, wherein the forming the first gate dielectric layer and the forming the second gate dielectric layer are performed such that the second gate dielectric layer has fewer traps than the first gate dielectric layer.

6. The method of claim 1, wherein the active region protrudes vertically out of a substrate.

7. The method of claim 1, wherein:
the second gate dielectric layer is formed to be in direct contact with the upper surface of the first gate dielectric layer that faces upwards in the vertical direction and in direct contact with side surfaces of the first gate dielectric layer that faces in a horizontal direction; and
a bottom surface of the metal-containing gate electrode is formed to be in direct contact with an upper surface of the second gate dielectric layer that faces upwards in the vertical direction.

8. The method of claim 1, wherein:
the first gate dielectric layer has a first peak concentration level of the first material composition;
the second gate dielectric layer has a second peak concentration level of the second material composition; and
the forming the first gate dielectric layer and the forming of the second gate dielectric layer are performed such that a ratio of the first peak concentration level and the second peak concentration level is in a range between about 6:1 and about 22:1.

9. The method of claim 1, wherein the interfacial layer contains silicon oxide.

10. A method, comprising:
depositing a first gate dielectric layer directly on a surface of an interfacial layer, wherein the first gate dielectric layer has a first thickness and a first material composition comprising hafnium oxide, wherein the first gate dielectric layer has a first peak concentration level of the first material composition;
depositing a bottom surface of a second gate dielectric layer directly on a top surface of the first gate dielectric layer, wherein the second gate dielectric layer has a second thickness and a second material composition comprising zirconium oxide, titanium oxide, or lanthanum oxide, wherein the first material composition and the second material composition are each different from a third material composition of the interfacial layer, wherein the depositing the first gate dielectric layer and the depositing the second gate dielectric layer is performed such that a ratio of the first thickness and the second thickness is in a range between about 2:1 and about 3.6:1, and wherein the second gate dielectric layer has a second peak concentration level of the second material composition, and wherein a ratio of the first peak concentration level and the second peak concentration level is in a range between about 6:1 and about 22:1; and forming a metal-containing gate electrode directly on a surface of the second gate dielectric layer.

11. The method of claim 10, wherein the interfacial layer is formed over an upwardly protruding semiconductive fin structure.

12. The method of claim 10, wherein the depositing the first gate dielectric layer and the depositing the second gate dielectric layer are performed within a same atomic layer deposition chamber.

13. A method, comprising:
forming an interfacial layer over a channel region of a substrate, the interfacial layer containing silicon dioxide;
depositing, using a first atomic layer deposition (ALD) process, a first type of dielectric material as a first part of a gate dielectric directly on the interfacial layer, wherein the first type of dielectric material has a first thickness and contains hafnium oxide;
depositing, using a second ALD process, a second type of dielectric material as a second part of the gate dielectric over the first type of dielectric material, wherein a bottom surface of the second type of dielectric material is deposited directly on an upper surface of the first type of dielectric material that faces upwards in a vertical direction, wherein a side surface of the second type of dielectric material is in direct contact with a side surface of the first type of dielectric material that faces a horizontal direction, wherein the second type of dielectric material has a second thickness and contains zirconium oxide, titanium oxide, or lanthanum oxide, and wherein the first ALD process and the second ALD process are configured such that a ratio of the first thickness and the second thickness is in a range between about 2:1 and about 3.6:1; and forming a metal-containing gate electrode directly on the second type of dielectric material, wherein a bottom surface of the metal-containing gate electrode is formed to be in direct contact with an upper surface of the second type of dielectric material that faces upwards in the vertical direction.

14. The method of claim 13, wherein:
the first ALD process and the second ALD process are performed in a same ALD chamber; and
the first ALD process is performed with a longer process duration than the second ALD process.

15. The method of claim 14, wherein the first thickness and the second thickness are configured by a process duration of the first ALD and the process duration of the second ALD process.

16. The method of claim 13, wherein the channel region protrudes vertically out of the substrate in a cross-sectional side view.

17. The method of claim 13, wherein the forming the metal-containing gate electrode comprises:
   depositing a work function metal component of a gate electrode directly on the second type of dielectric material; and
   depositing a fill metal component of the gate electrode over the work function metal component.

18. The method of claim 13, wherein the interfacial layer contains silicon oxide.

19. The method of claim 13, wherein:
   the first type of dielectric material has a first peak concentration level of hafnium oxide;
   the second type of dielectric material has a second peak concentration level of zirconium oxide, titanium oxide, or lanthanum oxide; and
   the depositing of the first type of dielectric material and the depositing of the second type of dielectric material are performed such that a ratio of the first peak concentration level and the second peak concentration level is in a range between about 6:1 and about 22:1.

20. The method of claim 13, wherein the forming the depositing the first type of dielectric material and the depositing the second type of dielectric material are performed as a part of a fabrication of a Static Random Access Memory (SRAM) device.

* * * * *